(12) United States Patent
Lim et al.

(10) Patent No.: US 11,871,598 B2
(45) Date of Patent: Jan. 9, 2024

(54) DISPLAY DEVICE AND METHOD OF MANUFACTURING THEREOF

(71) Applicant: Samsung Display Co., Ltd., Yongin-si (KR)

(72) Inventors: Baek Hyeon Lim, Yongin-si (KR); Jin Taek Kim, Yongin-si (KR); Seung Min Lee, Yongin-si (KR); Jung Hwan Yi, Yongin-si (KR); Hee Keun Lee, Yongin-si (KR); Kyung Tae Chae, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 72 days.

(21) Appl. No.: 17/315,847

(22) Filed: May 10, 2021

(65) Prior Publication Data

US 2021/0367183 A1 Nov. 25, 2021

(30) Foreign Application Priority Data

May 22, 2020 (KR) .................. 10-2020-0061894

(51) Int. Cl.
| | |
|---|---|
| *H10K 50/813* | (2023.01) |
| *H01L 33/50* | (2010.01) |
| *H10K 50/822* | (2023.01) |
| *H10K 59/122* | (2023.01) |
| *H10K 59/124* | (2023.01) |
| *H10K 71/00* | (2023.01) |

(52) U.S. Cl.
CPC .......... *H10K 50/813* (2023.02); *H01L 33/50* (2013.01); *H10K 50/822* (2023.02); *H10K 59/122* (2023.02); *H10K 59/124* (2023.02); *H10K 71/00* (2023.02)

(58) Field of Classification Search
None
See application file for complete search history.

(56) References Cited

U.S. PATENT DOCUMENTS

| | | | |
|---|---|---|---|
| 8,872,214 B2 | 10/2014 | Negishi et al. | |
| 9,112,112 B2 | 8/2015 | Do et al. | |
| 9,773,761 B2 | 9/2017 | Do | |
| 2007/0295973 A1* | 12/2007 | Jinbo | H01L 33/62 |
| | | | 257/88 |
| 2011/0089850 A1 | 4/2011 | Shibata et al. | |

(Continued)

FOREIGN PATENT DOCUMENTS

| | | |
|---|---|---|
| KR | 10-1244926 | 3/2013 |
| KR | 10-1490758 | 2/2015 |

(Continued)

*Primary Examiner* — Michelle Mandala
(74) *Attorney, Agent, or Firm* — Lewis Roca Rothgerber Christie LLP

(57) ABSTRACT

A display device and a manufacturing method thereof are provided. A display device includes: a substrate; a first electrode and a second electrode on the substrate, the first electrode and the second electrode being arranged on a same layer to be spaced apart from each other; a first insulating layer on the first electrode and the second electrode; and a light emitting element on the first insulating layer. The first insulating layer includes a groove concave toward the substrate, and the light emitting element is in the groove.

12 Claims, 21 Drawing Sheets

(56) References Cited

U.S. PATENT DOCUMENTS

| | | | | |
|---|---|---|---|---|
| 2014/0070175 A1* | 3/2014 | Kang | ..................... | H01L 51/52 438/34 |
| 2016/0211415 A1 | 7/2016 | Huang et al. | | |
| 2016/0329434 A1 | 11/2016 | Ito et al. | | |
| 2018/0019426 A1 | 1/2018 | Im et al. | | |
| 2020/0152835 A1 | 5/2020 | Ko et al. | | |
| 2021/0375194 A1* | 12/2021 | Kwag | ..................... | G09G 3/32 |
| 2021/0391380 A1* | 12/2021 | Li | ......................... | H01L 33/62 |

FOREIGN PATENT DOCUMENTS

| | | |
|---|---|---|
| KR | 10-2021-0003991 | 1/2021 |
| TW | 202006940 A | 2/2020 |

\* cited by examiner

DISPLAY DEVICE AND METHOD OF MANUFACTURING THEREOF

CROSS-REFERENCE TO RELATED APPLICATION

This application claims priority to and the benefit of Korean Patent Application No. 10-2020-0061894, filed on May 22, 2020 in the Korean Intellectual Property Office, the entire disclosure of which is incorporated herein by reference.

BACKGROUND

1. Field

Aspects of embodiments of the present disclosure relate to a display device and a manufacturing method thereof.

2. Description of the Related Art

As interest in information displays and demand for portable information media increase, research and commercialization has focused on display devices.

SUMMARY

According to aspects of embodiments of the present disclosure, a display device having reduced manufacturing cost and improved reliability, and a manufacturing method of the display device are provided.

According to one or more embodiments of the present disclosure, a display device includes: a substrate; a first electrode and a second electrode on the substrate, the first electrode and the second electrode being arranged on a same layer to be spaced apart from each other; a first insulating layer on the first electrode and the second electrode; and a light emitting element on the first insulating layer, wherein the first insulating layer includes a groove concave toward the substrate, and wherein the light emitting element is in the groove.

The light emitting element may include a first end portion and a second end portion which face away from each other. A side surface of the groove of the first insulating layer may be in contact with at least a portion of the first end portion and at least a portion of the second end portion.

The display device may further include: a third electrode electrically connecting the first electrode and the first end portion of the light emitting element; and a fourth electrode electrically connecting the second electrode and the second end portion of the light emitting element.

The first insulating layer may include a first opening exposing a portion of the first electrode and a second opening exposing a portion of the second electrode. The third electrode may be in contact with the first electrode through the first opening, and the fourth electrode may be in contact with the second electrode through the second opening.

The display device may further include a second insulating layer on the third electrode and the fourth electrode.

The display device may further include a wavelength conversion layer on the second insulating layer. The wavelength conversion layer may include a wavelength conversion particle and a scattering particle. The wavelength conversion particle may be a quantum dot.

The display device may further include a fixed layer surrounding at least a portion of an outer circumference of the light emitting element. The fixed layer may be between the third electrode and the fourth electrode.

A depth of the groove may be smaller than a diameter of the light emitting element.

A width of the groove in a first direction may be equal to a length of the light emitting element.

The display device may further include: a first bank between the substrate and the first electrode; and a second bank between the substrate and the second electrode. The light emitting element may be between the first bank and the second bank.

The first insulating layer may include an organic material.

The display device may further include a pixel circuit layer between the substrate and the light emitting element. The pixel circuit layer may include at least one transistor.

According to one or more embodiments of the present disclosure, a method of manufacturing a display device includes: forming a first electrode and a second electrode on a substrate; forming an insulating material layer including an organic material on the first electrode and the second electrode; aligning a light emitting element on the insulating material layer; and forming a first insulating layer by curing the insulating material layer, wherein, in the forming of the first insulating layer, the insulating material layer reflows, and a portion of the light emitting element is buried in and fixed to the insulating material layer.

A depth to which the light emitting element is buried in the insulating material layer may be smaller than a diameter of the light emitting element.

The light emitting element may include a first end portion and a second end portion which face away from each other. At least a portion of the first insulating layer may be in contact with a portion of the first end portion and a portion of the second end portion.

The method may further include forming a first opening and a second opening which penetrate the first insulating layer. The first opening may expose a portion of the first electrode, and the second opening may expose a portion of the second electrode.

The method may further include: forming a conductive material layer on the first insulating layer; and forming a third electrode and a fourth electrode by patterning a portion of the conductive material layer. The third electrode may electrically connect the first electrode and the first end portion of the light emitting element, and the fourth electrode may electrically connect the second electrode and the second end portion of the light emitting element.

The third electrode and the fourth electrode may be spaced apart from each other. The third electrode may be in contact with the first electrode through the first opening, and the fourth electrode may be in contact with the second electrode through the second opening.

The method may further include forming a second insulating layer on the third electrode and the fourth electrode, wherein the second insulating layer covers the light emitting element, the third electrode, and the fourth electrode.

The method may further include forming a first bank and a second bank on the substrate, before the forming of the first electrode and the second electrode. The first electrode may be formed on the first bank, and the second electrode may be formed on the second bank. In the aligning of the light emitting element, the light emitting element may be aligned between the first bank and the second bank.

DETAILED DESCRIPTION

Figure 1:
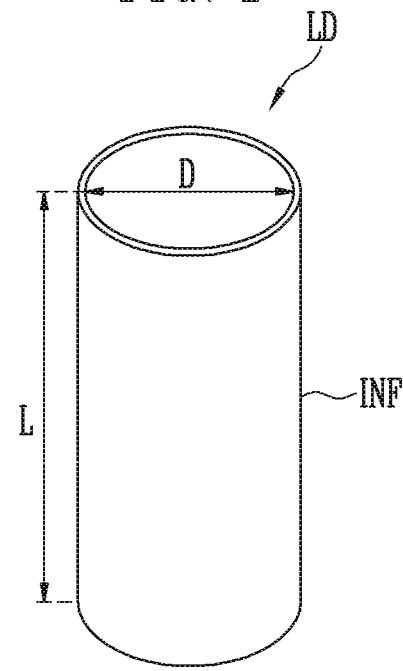
FIGS. 1 and 2 are a perspective view and a cross-sectional view illustrating a light emitting element in accordance with an embodiment of the present disclosure.

Some example embodiments will now be described more fully herein with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It is to be understood that when an element is referred to as being "between" two elements, it may be the only element between the two elements, or one or more intervening elements may also be present. Like reference numerals refer to like elements throughout.

Effects and characteristics of the present disclosure and a method of achieving the effects and characteristics will be clear by referring to the embodiments described below together with the accompanying drawings. However, the present disclosure is not limited to the embodiments disclosed herein but may be implemented in various forms. The embodiments are provided by way of example so that a person of ordinary skill in the art can fully understand the features in the present disclosure and the scope thereof. Therefore, the present disclosure may be defined by the scope of the appended claims.

The term "on" that may be used to designate that an element or layer is on another element or layer includes both a case in which an element or layer is located directly on another element or layer, and a case in which an element or layer is located on another element or layer via still another element or layer. The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. In the drawings, a portion irrelevant to the present disclosure may be omitted or simply expressed to clarify descriptions of the present disclosure.

It is to be understood that, although the terms "first," "second," etc. may be used herein to describe various elements, these elements should not be limited by these terms. These terms are used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

Respective characteristics of several example embodiments of the present disclosure may be partially or entirely coupled or combined, and technically and variously connected enough for those skilled in the art to fully understand, and respective example embodiments may be independently carried out, and implemented together according to an associated relation.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Herein, some example embodiments of the present disclosure will be described in further detail with reference to the accompanying drawings.

Figure 2:
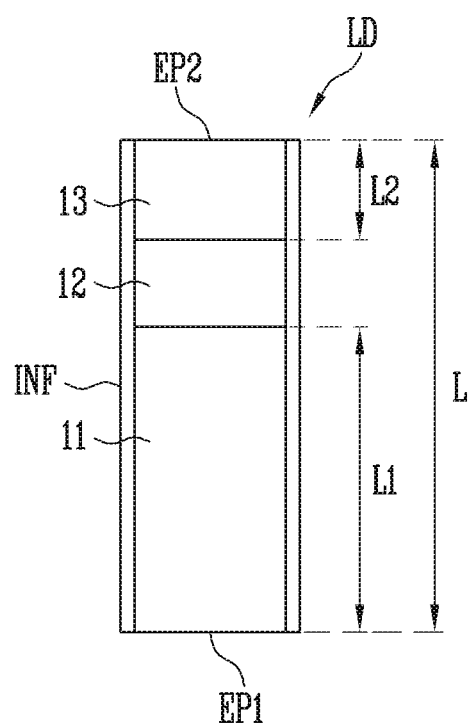

FIGS. 1 and 2 are a perspective view and a cross-sectional view illustrating a light emitting element in accordance with an embodiment of the present disclosure. Although a rod type light emitting element LD having a cylindrical shape is illustrated in FIGS. 1 and 2, the kind and/or shape of the light emitting element LD in accordance with the present disclosure is not limited thereto.

Referring to FIGS. 1 and 2, the light emitting element LD may include a first semiconductor layer 11, a second semiconductor layer 13, and an active layer 12 interposed between the first semiconductor layer 11 and the second semiconductor layer 13. In an example, the light emitting element LD may be configured as a stack structure in which the first semiconductor layer 11, the active layer 12, and the second semiconductor layer 13 are sequentially stacked.

In some embodiments, the light emitting element LD may be provided in a rod shape extending along a direction. The light emitting element LD may include a first end portion EP1 and a second end portion EP2, which face away from each other along the direction. The first end portion EP1 and the second end portion EP2 may be surfaces exposed to the outside.

In an example, the first semiconductor layer 11 may be disposed at the first end portion EP1 of the light emitting element LD, and the second semiconductor layer 13 may be disposed at the second end portion EP2 of the light emitting element LD. However, the first semiconductor layer 11 may be disposed at the second end portion EP2 of the light emitting element LD, and the second semiconductor layer 13 may be disposed at the first end portion EP1 of the light emitting element LD.

In some embodiments, the light emitting element LD may be a rod type light emitting diode manufactured in a rod shape. The rod shape may include a rod-like shape or bar-like shape, which is longer in a length direction thereof (i.e. an aspect ratio thereof is greater than 1) than in a width direction thereof, such as a cylinder or a polyprism, and the shape of a cross-section thereof is not particularly limited. For example, a length L of the light emitting element LD may be greater than a diameter D (or a width of a cross-section) of the light emitting element LD.

In some embodiments, the light emitting element LD may have a size small to a degree of micro scale or nano scale, e.g., a diameter D and/or a length L in a range of 100 nm to 10 μm. However, the size of the light emitting element LD is not limited thereto. For example, the size of the light emitting element LD may be variously modified according to design conditions of various types of devices, e.g., a display device, and the like, which use, as a light source, a light emitting apparatus using the light emitting element LD.

In an embodiment, the first semiconductor layer 11 may include at least one n-type semiconductor material. For example, the first semiconductor layer 11 may include at least one semiconductor material among InAlGaN, GaN, AlGaN, InGaN, AlN, and InN, and include an n-type semiconductor material doped with a first conductive dopant, such as Si, Ge or Sn. However, the material constituting the first semiconductor layer 11 is not limited thereto. In addition, various materials may constitute the first semiconductor layer 11.

The active layer 12 is formed on the first semiconductor layer 11, and may be formed in a single or multiple quantum well structure. When the active layer 12 includes a material having the multiple quantum well structure, the active layer 12 may have a structure in which a plurality of quantum layers and well layers are alternately stacked.

When an electric field having a voltage (e.g., a predetermined voltage) or more is applied between both the end portions of the light emitting element LD, the light emitting element LD emits light while electron-hole pairs are being combined in the active layer 12. The light emission of the light emitting element LD is controlled by using such a principle, such that the light emitting element LD can be used as a light source of various light emitting apparatuses, including a pixel of a display device.

In an embodiment, the active layer 12 may emit light having a wavelength of 400 nm to 900 nm. In an example, when the active layer 12 emits light in a blue or green wavelength band, the active layer 12 may include an inorganic material including nitrogen, such as AlGaN or AlGaInN. In particular, when the active layer 12 has a structure in which quantum layers and well layers are alternately stacked in a multiple quantum well structure, the quantum layer may include an inorganic material such as AlGaN or AlGaInN, and the well layer may include an inorganic material such as GaN or AlInN. In an example embodiment, the active layer 12 may include AlGaInN as the quantum layer, and include AlInN as the well layer.

However, the present disclosure is not limited thereto, and the active layer 12 may have a structure in which semiconductor materials having large band gap energy and semiconductor materials having small band gap energy are alternately stacked. Also, the active layer 12 may include different semiconductor materials of Groups III to V according to a wavelength band of light emitted therefrom. The light emitted from the active layer 12 is not limited to light in a blue or green wavelength band, and may be light in a red wavelength band according to a material included therein.

Meanwhile, the light emitted from the active layer 12 may be emitted to the first end portion EP1 and the second end portion EP2 of the light emitting element LD along the length direction of the light emitting element LD. Also, the light emitted from the active layer 12 may be emitted to a side surface (or outer circumference) of the active layer 12. The directivity of the light emitted from the active layer 12 is not limited to one direction.

The second semiconductor layer 13 is disposed on the active layer 12, and may include a semiconductor material having a type different from that of the first semiconductor layer 11. In an example, the second semiconductor layer 13 may include at least one p-type semiconductor material. For example, the second semiconductor layer 13 may include at least one semiconductor material among InAlGaN, GaN, AlGaN, InGaN, AlN, and InN, and include a p-type semiconductor material doped with a second conductive dopant, such as Mg, Zn, Ca, Se or Ba. However, the material constituting the second semiconductor layer 13 is not limited thereto. In addition, various materials may constitute the second semiconductor layer 13.

Further, although a case in which the first semiconductor layer 11 and the second semiconductor layer 13 are each configured as one layer is illustrated in the drawings, the present disclosure is not limited thereto. For example, the first semiconductor layer 11 and the second semiconductor layer 13 may include a larger number of layers according to the material of the active layer 12. In an example, the first semiconductor layer 11 and the second semiconductor layer 13 may further include a clad layer or a tensile strain barrier reducing (TSBR) layer.

In some embodiments, a first length L1 of the first semiconductor layer 11 may be longer than a second length L2 of the second semiconductor layer 13.

In some embodiments, the light emitting element LD may further include an insulative film INF provided on a surface thereof. The insulative film INF may be formed on the surface of the light emitting element LD to surround the outer circumference of the active layer 12. In addition, the insulative film INF may further surround the first semiconductor layer 11 and the second semiconductor layer 13.

In some embodiments, the insulative film INF may expose the first end portion EP1 and the second end portion EP2 of the light emitting element LD. For example, the insulative film INF does not cover ends of the first semiconductor layer 11 and the second semiconductor layer 13, which are located at both ends of the light emitting element LD in the length direction, e.g., two planes (i.e. an upper surface and a lower surface) of a cylinder, but may expose the ends of the first semiconductor layer 11 and the second semiconductor layer 13.

In some embodiments, the insulative film INF may include a transparent insulating material. For example, the insulative film INF may include at least one insulating material among $SiO_2$, $Si_3N_4$, $Al_2O_3$, and $TiO_2$. However, the material constituting the insulative film INF is not particularly limited, and the insulative film INF may be made of various insulating materials currently known in the art.

The insulative film INF may prevent or substantially prevent an electrical short circuit which may occur when the active layer 12 is in contact with a conductive material except the first semiconductor layer 11 and the second semiconductor layer 13. Also, when the insulative film INF is formed, a surface defect of the light emitting element LD is minimized or reduced, thereby improving the lifespan and efficiency of the light emitting element LD. Also, when a plurality of light emitting elements LD are densely disposed, the insulative film INF can prevent or substantially prevent an unwanted short circuit which may occur between the light emitting elements LD.

In an embodiment, the light emitting element LD may further include an additional component disposed on the top and/or the bottom of each layer, in addition to the first semiconductor layer 11, the active layer 12, the second semiconductor layer 13, and/or the insulative film INF. For example, the light emitting element LD may further include at least one phosphor layer, at least one active layer, at least one semiconductor material layer, and/or at least one electrode layer, which are disposed at ends of the first semiconductor layer 11, the active layer 12, and/or the second semiconductor layer 13.

Figure 3:
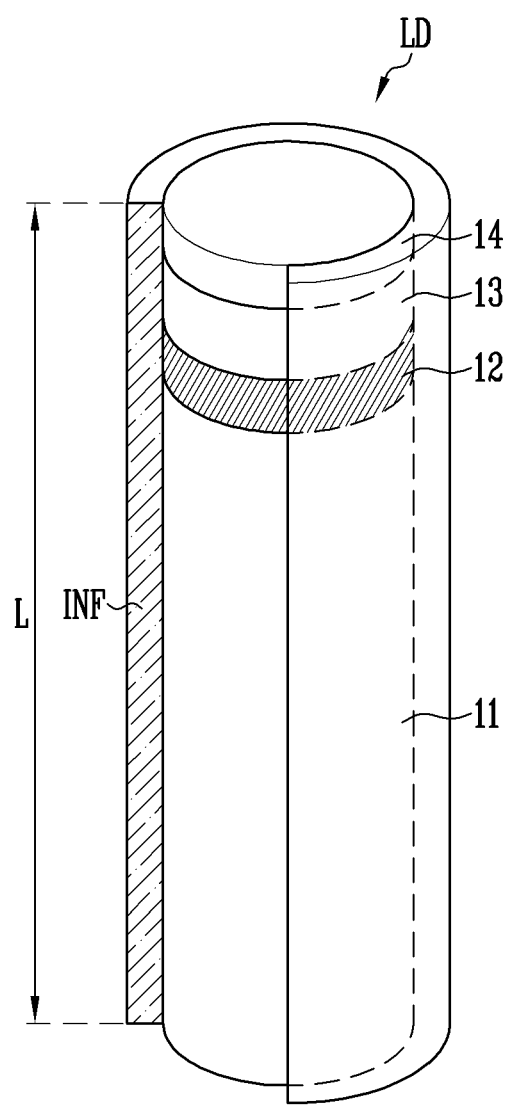
FIG. 3 is a perspective view illustrating a light emitting element in accordance with another embodiment of the present disclosure.

FIG. 3 is a perspective view illustrating a light emitting element in accordance with another embodiment of the present disclosure. For convenience of description, a portion of the insulative film INF is omitted and illustrated in FIG. 3.

Referring further to FIG. 3 in conjunction with FIGS. 1 and 2, the light emitting element LD may further include an electrode layer 14 disposed on the second semiconductor layer 13.

In an embodiment, the electrode layer 14 may be an ohmic contact electrode electrically connected to the second semiconductor layer 13, but the present disclosure is not limited thereto. In some embodiments, the electrode layer 14 may be a Schottky contact electrode. The electrode layer 14 may include a metal or a metal oxide. In an example, the electrode layer 14 may include any of Cr, Ti, Al, Au, Ni, indium tin oxide (ITO), indium zinc oxide (IZO), indium tin zinc oxide (ITZO), oxides or alloys thereof, and the like.

In some embodiments, the electrode layer 14 may be substantially transparent or translucent. Accordingly, light generated in the active layer 12 of the light emitting element LD can be emitted to the outside of the light emitting element LD while being transmitted through the electrode layer 14.

Figure 4:
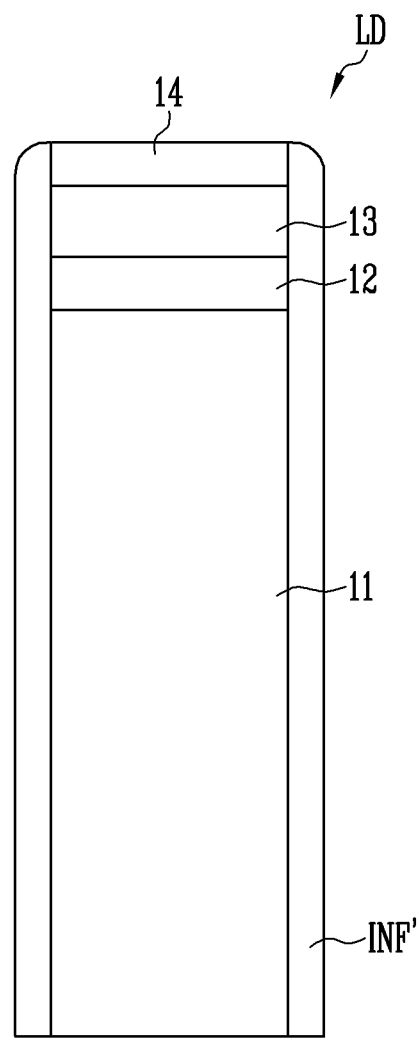
FIG. 4 is a cross-sectional view illustrating a light emitting element in accordance with another embodiment of the present disclosure.

FIG. 4 is a cross-sectional view illustrating a light emitting element in accordance with another embodiment of the present disclosure.

Referring further to FIG. 4 in conjunction with FIG. 3, an insulative film INF' may have a curved shape in at least a portion of a corner region adjacent to the electrode layer 14. In some embodiment, the curved shape may be formed through an etching process, when the light emitting element LD is manufactured.

Meanwhile, the insulative film INF' may have a curved shape in at least a portion of a corner region even when the electrode layer 14 is not included in the light emitting element LD shown in FIGS. 1 and 2.

Figure 5:
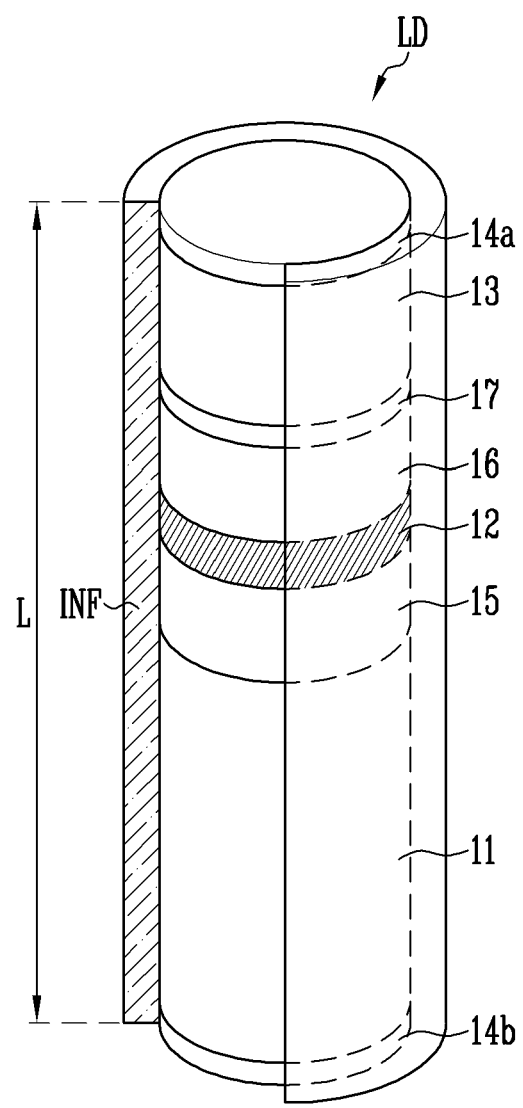
FIG. 5 is a perspective view illustrating a light emitting element in accordance with another embodiment of the present disclosure.

FIG. 5 is a perspective view illustrating a light emitting element in accordance with another embodiment of the present disclosure. For convenience of description, a portion of the insulative film INF is omitted and illustrated in FIG. 5.

Referring further to FIG. 5 in conjunction with FIGS. 1 and 2, the light emitting element LD may further include a third semiconductor layer 15 disposed between the first semiconductor layer 11 and the active layer 12, and a fourth semiconductor layer 16 and a fifth semiconductor layer 17, which are disposed between the active layer 12 and the second semiconductor layer 13. Also, the light emitting element LD may further include a first electrode layer 14*a* formed on an upper surface of the second semiconductor layer 13 and a second electrode layer 14*b* formed on a lower surface of the first semiconductor layer 11.

The light emitting element LD shown in FIG. 5 is different from the embodiment shown in FIG. 1 in that the plurality of semiconductor layers 15, 16, and 17 and the electrode layers 14*a* and 14*b* are further disposed, and the active layer 12 contains another element. Otherwise, the disposition and structure of the insulative film INF are substantially the same as those shown in FIG. 1.

As described above, in the light emitting element LD shown in FIG. 1, the active layer 12 may include nitrogen (N), thereby emitting blue or green light. In the light emitting element LD shown in FIG. 5, each of the active layer 12 and the semiconductor layers 11, 13, 15, 16, and 17 may be a semiconductor including phosphorus (P). That is, the light emitting element LD in accordance with the embodiment shown in FIG. 5 may emit red light which has a center wavelength band in a range of 620 nm to 750 nm. However, the center wavelength band of the red light is not limited to the above-described range, and it should be understood that the center wavelength band of the red light includes all wavelength ranges which can be recognized as red in this technical field.

In the light emitting element LD in accordance with the embodiment shown in FIG. 5, the first semiconductor layer 11 may include an n-type semiconductor material. For example, the first semiconductor layer 11 may include a semiconductor material among InAlGaN, GaN, AlGaN, InGaN, AlN, and InN, and include an n-type semiconductor material doped with a first conductive dopant, such as Si, Ge or Sn. In an example embodiment, the first semiconductor layer 11 may be n-ALGaInP doped with n-type Si.

The second semiconductor layer 13 may include a p-type semiconductor material. For example, the second semiconductor layer 13 may include a semiconductor material among InAlGaN, GaN, AlGaN, InGaN, AlN, and InN, and include a p-type semiconductor material doped with a second conductive dopant, such as Mg, Zn, Ca, Se or Ba. In an example embodiment, the second semiconductor layer 13 may be p-GaP doped with p-type Mg.

The active layer 12 may be disposed between the first semiconductor layer 11 and the second semiconductor layer 13. Like the active layer 12 shown in FIG. 1, the active layer 12 shown in FIG. 5 may include a material having a single or multiple quantum well structure, thereby emitting light in a specific wavelength band. In an example, the active layer 12 may include a material such as AlGaP or AlInGaP. In particular, when the active layer 12 has a structure in which quantum layers and well layers are alternately stacked in a multiple quantum well structure, the quantum layer may include a material such as AlGaN or AlGaInN, and the well layer may include a material such as GaN or AlInN. In an example embodiment, the active layer 12 may include AlGaInP as the quantum layer and include AlInP as the well layer, thereby emitting red light having a center wavelength band of 620 nm to 750 nm.

In an embodiment, the light emitting element LD shown in FIG. 5 may include a clad layer disposed adjacent to the active layer 12. For example, the third semiconductor layer 15 and the fourth semiconductor layer 16 disposed at the top and the bottom of the active layer 12 between the first semiconductor layer 11 and the second semiconductor layer 13 may be clad layers.

The third semiconductor layer 15 may be disposed between the first semiconductor layer 11 and the active layer 12. Like the first semiconductor layer 11, the third semiconductor layer 15 may include an n-type semiconductor material. In an example embodiment, the third semiconductor layer 15 may be n-AlInP, but the present disclosure is not limited thereto.

The fourth semiconductor layer 16 may be disposed between the active layer 12 and the second semiconductor layer 13. Like the second semiconductor layer 13, the fourth semiconductor layer 14 may include a p-type semiconductor material. In an example embodiment, the fourth semiconductor layer 16 may be p-AlInP.

The fifth semiconductor layer 17 may be disposed between the fourth semiconductor layer 16 and the second semiconductor layer 13. Like the second semiconductor layer 13 and the fourth semiconductor layer 16, the fifth semiconductor layer 17 may include a p-type semiconductor material. In some embodiments, the fifth semiconductor layer 17 may perform a function of reducing a lattice constant between the fourth semiconductor layer 16 and the second semiconductor layer 13. In an embodiment, for example, the fifth semiconductor layer 17 may be a tensile strain barrier reducing (TSBR) layer. In an example embodiment, the fifth semiconductor layer 17 may include p-GaInP, p-AlInP, p-AlGaInP, etc., but the present disclosure is not limited thereto.

The first electrode layer 14a and the second electrode layer 14b may be respectively disposed on the second semiconductor layer 13 and the first semiconductor layer 11. The first electrode layer 14a may be disposed on the upper surface of the second semiconductor layer 13, and the second electrode layer 14b may be disposed on the lower surface of the first semiconductor layer 11. In some embodiments, at least one of the first electrode layer 14a and the second electrode layer 14b may be omitted. Each of the first electrode layer 14a and the second electrode layer 14b may include at least one of the materials described above in the electrode layer 14 shown in FIG. 3.

Figure 6:
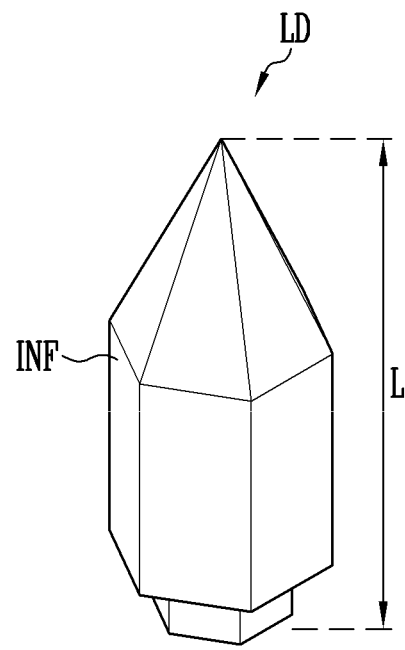
FIGS. 6 and 7 are a perspective view and a cross-sectional view illustrating a light emitting element in accordance with another embodiment of the present disclosure.
Figure 7:
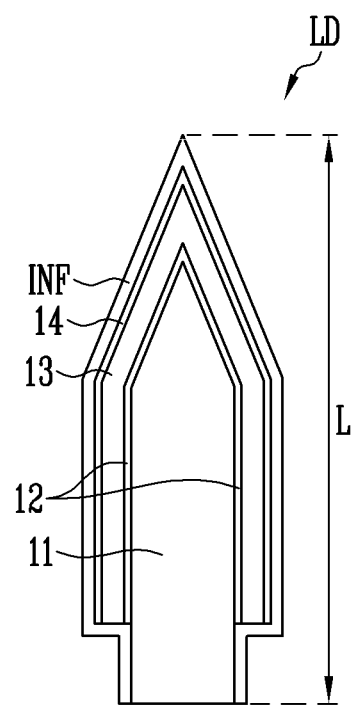

FIGS. 6 and 7 are a perspective view and a cross-sectional view illustrating a light emitting element in accordance with another embodiment of the present disclosure.

Referring to FIGS. 6 and 7, the light emitting element LD in accordance with another embodiment may include a first semiconductor layer 11, a second semiconductor layer 13, and an active layer 12 interposed between the first semiconductor layer 11 and the second semiconductor layer 13. In some embodiments, the first semiconductor layer 11 may be disposed in a central region of the light emitting element LD, and the active layer 12 may be disposed on a surface of the first semiconductor layer 11 to surround at least one region of the first semiconductor layer 11. In addition, the second semiconductor layer 13 may be disposed on a surface of the active layer 12 to surround at least one region of the active layer 12.

Also, the light emitting element LD may further include an electrode layer 14 surrounding at least one region of the second semiconductor layer 13 and/or an insulative film INF. For example, the light emitting element LD may further include the electrode layer 14 disposed on a surface of the second semiconductor layer 13 to surround at least one region of the second semiconductor layer 13, and the insulative film INF disposed on a surface of the electrode layer 14 to surround at least one region of the electrode layer 14. That is, the light emitting element LD in accordance with the above-described embodiment may be implemented in a core-shell structure including the first semiconductor layer 11, the active layer 12, the second semiconductor layer 13, the electrode layer 14, and the insulative film INF, which are sequentially disposed in a direction from the center to the outside. In some embodiments, the electrode layer 14 and/or the insulative film INF may be omitted.

In an embodiment, the light emitting element LD may be provided in a polypyramid shape extending in a direction (e.g., a length L direction). In an example, the light emitting element LD may have a hexagonal pyramid shape. However, the shape of the light emitting element LD is not limited thereto, and may be variously modified.

In an embodiment, both end portions of the first semiconductor layer 11 along the length L direction of the light emitting element LD may have protruding shapes. The shapes of both the end portions of the first semiconductor layer 11 may be different from each other. In an example, one of both the end portions of the first semiconductor layer 11, which is disposed at an upper side, may have a pyramid shape in contact with a vertex while having a width narrowed toward the top thereof. In addition, the other of both the end portions of the first semiconductor layer 11, which is disposed at a lower side, may have a polyprism shape having a constant width.

In some embodiments, the first semiconductor layer 11 may be located at a core, i.e. the center (or central region) of the light emitting element LD. In addition, the light emitting element LD may be provided in a shape corresponding to that of the first semiconductor layer 11. In an example, when the first semiconductor layer 11 has a hexagonal prism shape, the light emitting element LD may have a hexagonal prism shape.

In the following embodiments, a case in which the light emitting element LD shown in FIGS. 1 and 2 is applied is described as an example. However, those skilled in the art may apply light emitting elements having any of various shapes, which include the light emitting elements LD shown in FIGS. 3 to 7, to the embodiments.

Figure 8:
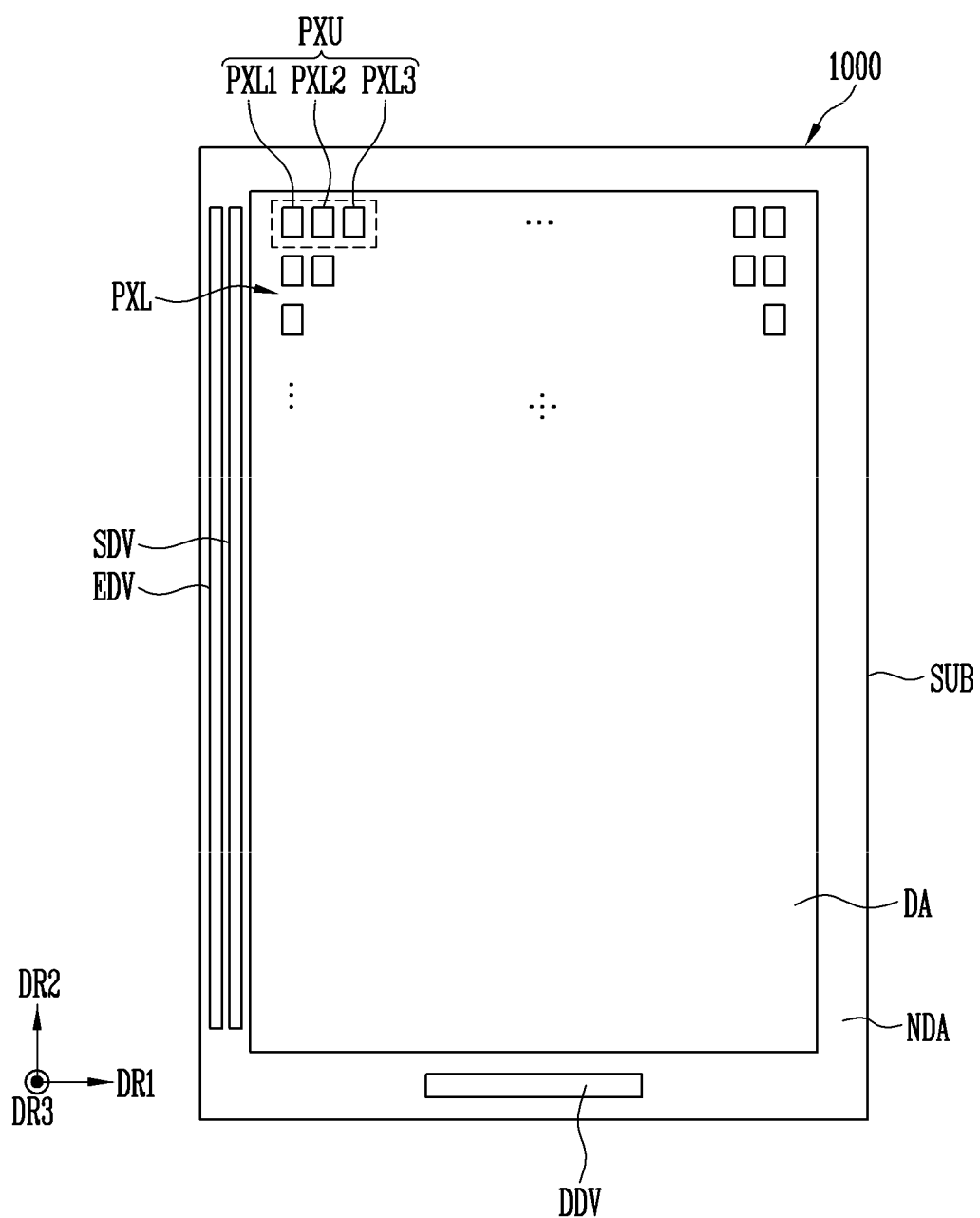
FIG. 8 is a plan view schematically illustrating a display device in accordance with an embodiment of the present disclosure.

FIG. 8 is a plan view schematically illustrating a display device in accordance with an embodiment of the present disclosure.

Referring to FIGS. 1, 2, and 8, a display device 1000 may include a substrate SUB and a plurality of pixels PXL provided on the substrate SUB. In addition, the substrate SUB may include a display region DA in which the plurality of pixels PXL are arranged to display an image and a non-display region NDA except the display region DA.

The display region DA may be a region in which the pixels PXL are provided. The non-display region NDA may be a region in which drivers SDV, DDV, and EDV for driving the pixels PXL and various lines connecting the pixels PXL and the drivers SDV, DDV, and EDV are provided.

The display region DA may have any of various shapes. For example, the display region DA may be provided in any of various shapes, such as a closed polygon including linear sides, a circle, an ellipse, etc., including a curved side, and a semicircle, a semi-ellipse, etc., including linear and curved sides.

When the display region DA includes a plurality of regions, each region may also be provided in the above-described various shapes. In addition, areas of the plurality of regions may be equal to or different from one another. In an embodiment of the present disclosure, a case in which the display region DA is provided as one region having a quadrangular shape including linear sides is described as an example.

The non-display region NDA may be provided at at least one side of the display region DA. In an embodiment, the non-display region NDA may surround the display region DA.

The pixels PXL may be provided in the display region DA on the substrate SUB. Each of the pixels PXL may include at least one light emitting element LD connected to a scan line and a data line to be driven by a corresponding scan signal and a corresponding data signal.

Each of the pixels PXL may emit light of a color among red, green, and blue, but the present disclosure is not limited thereto. For example, each of the pixels PXL may emit light of a color among cyan, magenta, yellow, and white.

In an embodiment, the pixels PXL may include a first pixel PXL1 (or first sub-pixel) emitting light of a first color, a second pixel PXL2 (or second sub-pixel) emitting light of a second color different from the first color, and a third pixel PXL3 (or third sub-pixel) emitting light of a third color different from the first color and the second color. The first pixel PXL1, the second pixel PXL2, and the third pixel PXL3, which are disposed adjacent to each other, may constitute one pixel unit PXU capable of emitting light of various colors.

In some embodiments, the first pixel PXL1 may be a red pixel emitting light of red, the second pixel PXL2 may be a green pixel emitting light of green, and the third pixel PXL3 may be a blue pixel emitting light of blue.

In an embodiment, the pixels PXL may respectively include light emitting elements LD emitting lights of the same color, and include different color conversion layers disposed on the light emitting elements LD, to emit lights of different colors. In another embodiment, the pixels PXL may respectively include light emitting elements LD emitting lights of different colors.

The pixels PXL may be provided in plural to be arranged along a first direction DR1 and a second direction DR2 intersecting the first direction DR1. However, the arrangement form of the pixels PXL is not particularly limited, and the pixels PXL may be arranged in any of various forms.

The drivers SDV, DDV, and EDV may provide signals to each of the pixels PXL through a line unit (not shown), and, accordingly, driving of each of the pixels PXL may be controlled. For convenience of description, the line unit is omitted in FIG. 8.

In an embodiment, the drivers SDV, DDV, and EDV may include a scan driver SDV which provides a scan signal to the pixels PXL through scan lines, a data driver DDV which provides a data signal to the pixels PXL through data lines, an emission control driver EDV which provides an emission control signal to the pixels PXL through emission control lines, and a timing controller (not shown). The timing controller may control the scan driver SDV, the data driver DDV, and the emission control driver EDV. In some embodiments, the emission control driver EDV may be omitted.

The scan driver SDV may be disposed at a side of the substrate SUB, and be disposed along a direction (e.g., the second direction DR2). The scan driver SDV may be mounted as a separate component on the substrate SUB, but the present disclosure is not limited thereto. For example, the scan driver SDV may be formed directly on the substrate SUB. In an embodiment, the scan driver SDV may be located at the outside of the substrate SUB, and be connected to each of the pixels PXL through a connection member.

In an embodiment, the data driver DDV may be disposed at a side of the substrate SUB, and be disposed along a direction (e.g., the first direction DR1) intersecting the direction along which the scan driver SDV is disposed. The data driver DDV may be mounted as a separate component on the substrate SUB, or be located at the outside of the substrate SUB and be connected to each of the pixels PXL through a connection member.

In an embodiment, the emission control driver EDV may be disposed at a side of the substrate SUB, and be disposed along the same direction (e.g., the second direction DR2) as the scan driver SDV. As shown in FIG. 8, the emission control driver EDV may be disposed at the same side as the scan driver SDV, but the present disclosure is not limited thereto. For example, the emission control driver EDV may be disposed at a side different from that of the scan driver SDV. The emission control driver EDV may be mounted as a separate component on the substrate SUB, but the present disclosure is not limited thereto. For example, the emission control driver EDV may be formed directly on the substrate SUB, or be located at the outside of the substrate SUB and be connected to each of the pixels PXL through a connection member.

In an embodiment, each of the pixels PXL may be configured as an active type pixel. However, the kind, structure, and/or driving method of the pixels PXL, which are applicable to the present disclosure, are not particularly limited.

Figure 9A:
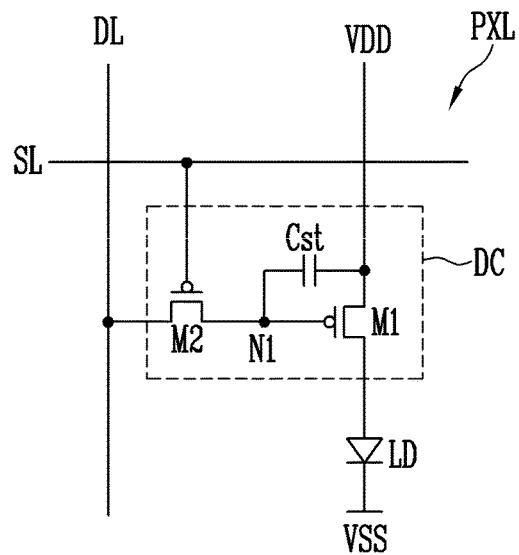
FIGS. 9A to 9C are circuit diagrams each illustrating a pixel in accordance with an embodiment of the present disclosure.
Figure 9B:
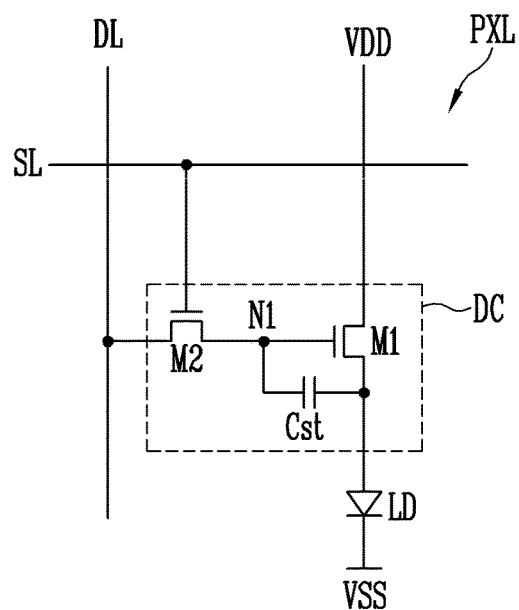
Figure 9C:
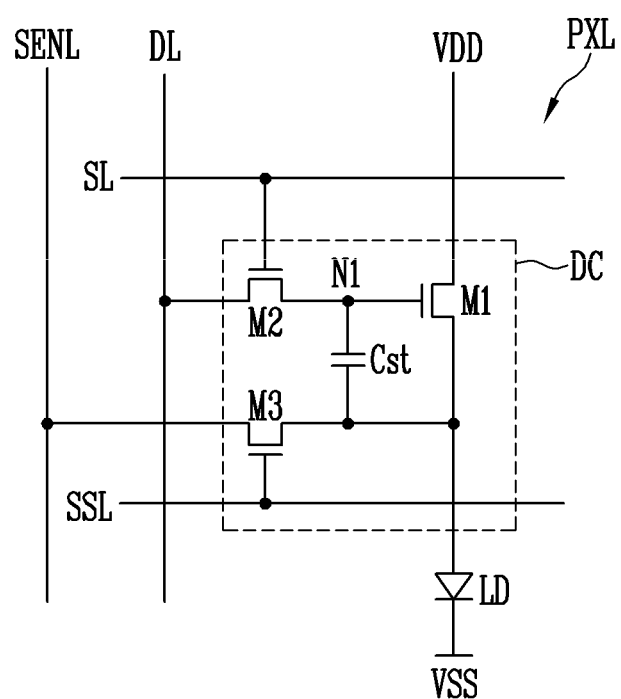

FIGS. 9A to 9C are circuit diagrams each illustrating a pixel in accordance with an embodiment of the present disclosure. In particular, FIGS. 9A to 9C each illustrates an example of a pixel constituting an active type light emitting display panel.

Referring to FIGS. 1, 2, and 9A, the pixel PX may include at least one light emitting element LD and a driving circuit DC connected to the light emitting element LD to drive the light emitting element LD.

A first electrode (e.g., an anode) of the light emitting element LD may be connected to a first driving power source VDD via the driving circuit DC, and a second electrode (e.g., a cathode) of the light emitting element LD may be connected to a second driving power source VSS. The light emitting element LD may emit light with a luminance corresponding to an amount of driving current, which is controlled by the driving circuit DC.

Although only one light emitting element LD is illustrated in FIG. 9A, this is merely illustrative. In some embodiments, one pixel PXL may include a plurality of light emitting elements LD. The plurality of light emitting elements LD included in the pixel PXL may be connected in parallel and/or series to each other.

The first driving power source VDD and the second driving power source VSS may have different potentials. In an example, the first driving power source VDD may have a potential higher by a threshold voltage or more of the light emitting element LD than that of the second driving power source VSS. That is, a voltage applied through the first driving power source VDD may be higher than that applied through the second driving power source VSS.

In accordance with an embodiment of the present disclosure, the driving circuit DC may include a first transistor M1, a second transistor M2, and a storage capacitor Cst.

A first electrode of the first transistor M1 (driving transistor) may be connected to the first driving power source VDD, and a second electrode of the first transistor M1 may be electrically connected to the first electrode (e.g., the anode) of the light emitting element LD. A gate electrode of the first transistor M1 may be connected to a first node N1. The first transistor M1 may control an amount of driving current supplied to the light emitting element LD, corresponding to a voltage of the first node N1.

A first electrode of the second transistor M2 (switching transistor) may be connected to a data line DL, and a second electrode of the second transistor M2 may be connected to the first node N1. The first electrode and the second electrode of the second transistor M2 are different electrodes. For example, when the first electrode is a source electrode, the second electrode may be a drain electrode. A gate electrode of the second transistor M2 may be connected to a scan line SL.

The second transistor M2 may be turned on when a scan signal having a voltage (e.g., a gate-on voltage) at which the first transistor M1 can be turned on is supplied from the scan line SL, to electrically connect the data line DL and the first node N1. A data signal of a corresponding frame may be supplied to the data line DL. Accordingly, the data signal can be transferred to the first node N1. The data signal transferred to the first node N1 may be stored in the storage capacitor Cst.

One electrode of the storage capacitor Cst may be connected to the first driving power source VDD, and the other electrode of the storage capacitor Cst may be connected to the first node N1. The storage capacitor Cst may be charged with a voltage corresponding to the data signal supplied to the first node N1, and maintain the charged voltage until a data signal of a next frame is supplied.

For convenience of description, the driving circuit DC having a relatively simple structure, which includes the second transistor M2 for transferring a data signal to the inside of each pixel PXL, the storage capacitor Cst for storing the data signal, and the first transistor M1 for supplying a driving current corresponding to the data signal to the light emitting element LD, has been illustrated in FIG. 9A.

However, the present disclosure is not limited thereto, and the structure of the driving circuit DC may be variously modified and embodied. In an example, the driving circuit DC may further additionally include other circuit elements, such as a compensation transistor for compensating for a threshold voltage of the first transistor M1, an initialization transistor for initializing the first node N1, and/or an emission control transistor for controlling an emission time of the light emitting element LD.

Although a case in which both the first transistor M1 and the second transistor M2, which are included in the driving circuit DC, are P-type transistors has been illustrated in FIG. 9A, the present disclosure is not limited thereto. That is, at least one of the first transistor M1 and the second transistor M2, which are included in the driving circuit DC, may be an N-type transistor.

For example, as shown in FIG. 9B, the first transistor M1 and the second transistor M2 of the driving circuit DC may be implemented with an N-type transistor. A configuration or operation of the driving circuit DC shown in FIG. 9B may be similar to that of the driving circuit DC shown in FIG. 9A, except that connection positions of some components (e.g., the storage capacitor Cst) are changed due to a change in transistor type.

In another example, referring to FIG. 9C, the pixel PX may further include a third transistor M3 (sensing transistor).

A gate electrode of the third transistor M3 may be connected to a sensing signal line SSL. One electrode of the third transistor M3 may be connected to a sensing line SENL, and the other electrode of the third transistor M3 may be connected to the first electrode (e.g., the anode) of the light emitting element LD. The third transistor M3 may transfer a voltage value of the first electrode of the light emitting element LD to the sensing line SENL according to a sensing signal supplied to the sensing signal line SSL in a sensing period. The voltage value transferred through the sensing line SENL may be provided to an external circuit (e.g., the timing controller), and the external circuit may extract characteristic information (e.g., a threshold voltage of the first transistor, etc.) of the pixel PXL, based on the provided voltage value. In an embodiment, the extracted characteristic information may be used to convert image data such that a characteristic deviation of the pixel PXL is compensated.

Figure 10:
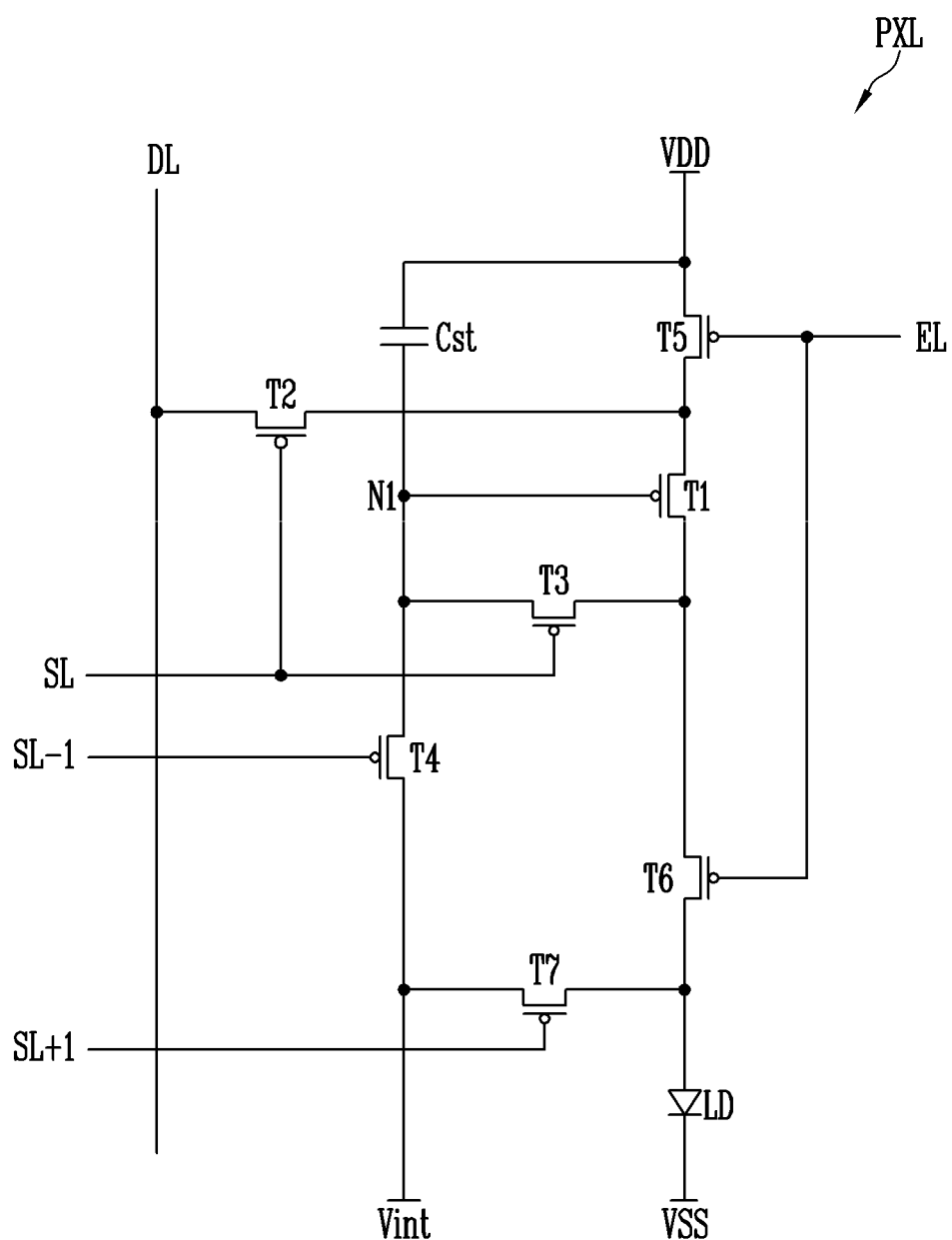
FIG. 10 is a circuit diagram illustrating a pixel in accordance with another embodiment of the present disclosure.

FIG. 10 is a circuit diagram illustrating a pixel in accordance with another embodiment of the present disclosure.

Referring to FIG. 10, the pixel PXL in accordance with another embodiment of the present disclosure may include a light emitting element LD, first to seventh transistors T1, T2, T3, T4, T5, T6, and T7, and a storage capacitor Cst.

A first electrode (e.g., an anode) of the light emitting element LD may be connected to the first transistor T1 via the sixth transistor T6, and a second electrode (e.g., a cathode) of the light emitting element LD may be connected to a second driving power source VSS. The light emitting element LD may emit light with a luminance (e.g., a predetermined luminance) corresponding to an amount of driving current supplied from the first transistor T1.

One electrode of the first transistor T1 (driving transistor) may be connected to a first driving power source VDD via the fifth transistor T5, and the other electrode of the first transistor T1 may be connected to the first electrode of the light emitting element LD via the sixth transistor T6. The first transistor T1 may control an amount of current flowing from the first driving power source VDD to the second driving power source VSS via the light emitting element LD, corresponding to a voltage of a first node N1 as a gate electrode of the first transistor T1.

The second transistor T2 (switching transistor) may be connected between a data line DL and the one electrode of the first transistor T1. A gate electrode of the second transistor T2 may be connected to a scan line SL. The second transistor T2 may be turned on when a scan signal having a gate-on voltage is supplied to the scan line SL, to electrically connect the data line DL and the one electrode of the first transistor T1.

The third transistor T3 may be connected between the other electrode of the first transistor T1 and the first node N1. A gate electrode of the third transistor T3 may be connected to the scan line SL. The third transistor T3 may be turned on when a scan signal having a gate-on voltage is supplied to the scan line SL, to electrically connect the other electrode of the first transistor T1 and the first node N1.

The fourth transistor T4 may be connected between the first node N1 and an initialization power source Vint. A gate electrode of the fourth transistor T4 may be connected to a scan line SL-1. The fourth transistor T4 may be turned on when a scan signal having a gate-on voltage is supplied to the scan line SL-1, to supply a voltage of the initialization power source Vint to the first node N1. The initialization power source Vint may be set to a voltage lower than that of a data signal. In an embodiment, the scan signal supplied to the scan line SL-1 may have the same waveform as a scan signal supplied to a scan line of a previous pixel.

The fifth transistor T5 may be connected between the first driving power source VDD and the one electrode of the first transistor T1. A gate electrode of the fifth transistor T5 may be connected to an emission control line EL. The fifth transistor T5 may be turned on when an emission control signal having a gate-on voltage is supplied to the emission control line EL, and be turned off in other cases.

The sixth transistor T6 may be connected between the other electrode of the first transistor T1 and the first electrode of the light emitting element LD. A gate electrode of the sixth transistor T6 may be connected to the emission control line EL. The sixth transistor T6 may be turned on when an emission control signal having a gate-on voltage is supplied to the emission control line EL, and be turned off in other cases.

The seventh transistor T7 may be connected between the initialization power source Vint and the first electrode (e.g., the anode) of the light emitting element LD. A gate electrode of the seventh transistor T7 may be connected to a scan line SL+1. The seventh transistor T7 may be turned on when a scan signal having a gate-on voltage is supplied to the scan line SL+1, to supply the voltage of the initialization power source Vint to the first electrode of the light emitting element LD. The scan signal supplied to the scan line SL+1 may have the same waveform as the scan signal supplied to the scan line SL, but the present disclosure is not limited thereto.

In FIG. 10, a case in which the gate electrode of the seventh transistor T7 is connected to the scan line SL+1 is illustrated. However, embodiments of the present disclosure are not limited thereto. For example, in another embodiment of the present disclosure, the gate electrode of the seventh transistor T7 may be connected to the scan line SL or the scan line SL−1. The voltage of the initialization power source Vint may be supplied to the first electrode of the light emitting element LD via the seventh transistor T7, when a scan signal having a gate-on voltage is supplied to the scan line SL or the scan line SL−1.

The storage capacitor Cst may be connected between the first driving power source VDD and the first node N1. A voltage corresponding to the data signal and a threshold voltage of the first transistor T1 may be stored in the storage capacitor Cst.

Meanwhile, although a case in which the transistors, e.g., the first to seventh transistors T1, T2, T3, T4, T5, T6, and T7 included in the driving circuit DC are all P-type transistors has been illustrated in FIG. 10, the present disclosure is not limited thereto. For example, at least one of the first to seventh transistors T1, T2, T3, T4, T5, T6, and T7 may be an N-type transistor.

Figure 11:
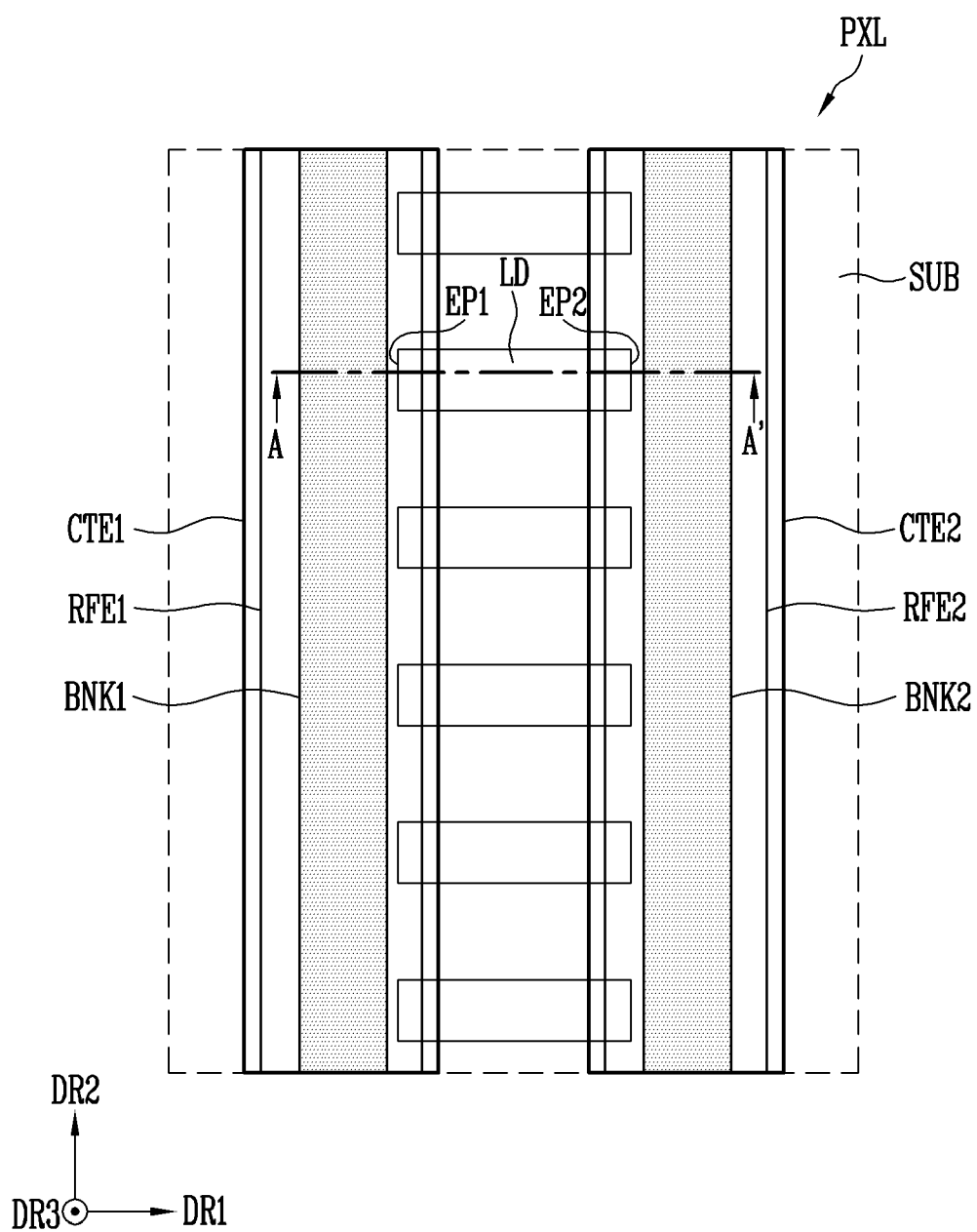
FIG. 11 is a plan view illustrating an example of a pixel included in the display device shown in FIG. 8.
Figure 12:
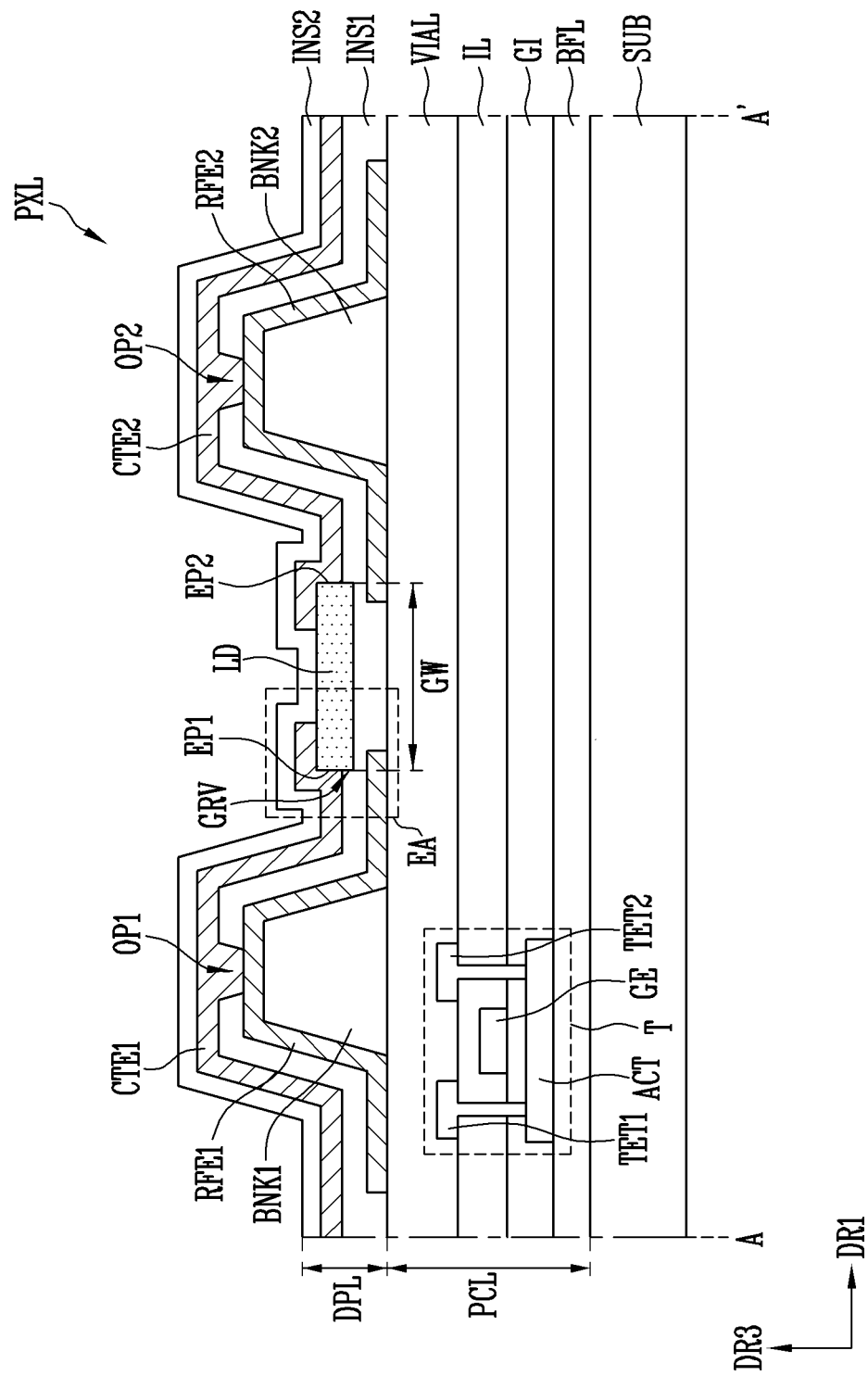
FIG. 12 is a cross-sectional view of the pixel taken along the line A-A' shown in FIG. 11.
Figure 13:
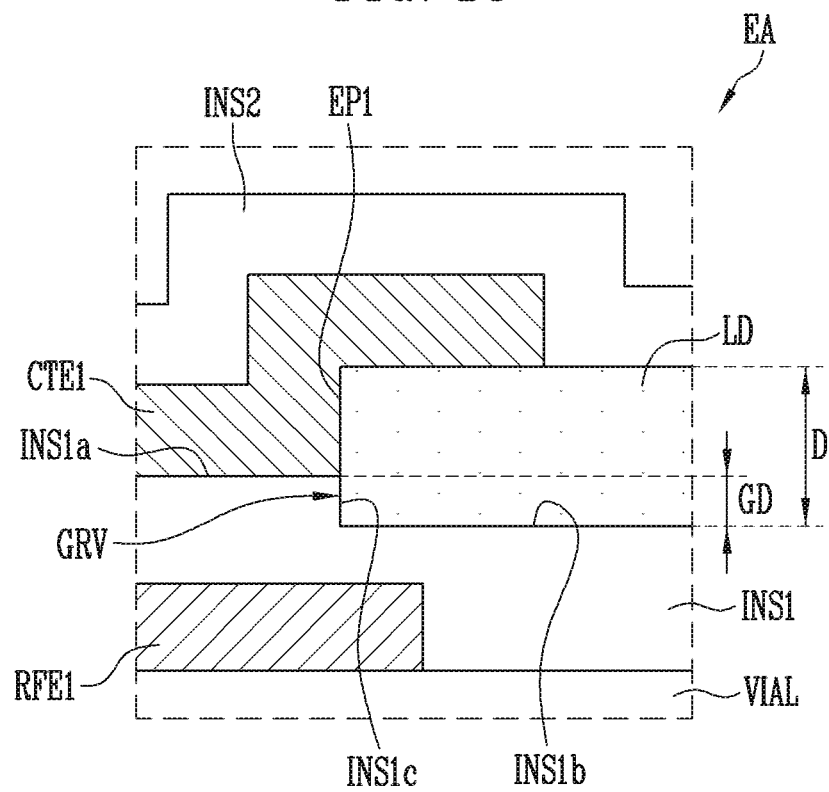
FIG. 13 is an enlarged cross-sectional view of a region "EA" shown in FIG. 12.

FIG. 11 is a plan view illustrating an example of the pixel included in the display device shown in FIG. 8; FIG. 12 is a cross-sectional view of the pixel taken along the line A-A' shown in FIG. 11; and FIG. 13 is an enlarged cross-sectional view of a region "EA" shown in FIG. 12.

For convenience of description, although each electrode is simplified and illustrated as a single electrode layer, the present disclosure is not limited thereto, and each electrode may be configured with a plurality of electrode layers. In an embodiment of the present disclosure, the term "being formed and/or disposed in the same layer" may mean being concurrently (e.g., simultaneously) formed in the same process and being formed of the same material.

Also, for convenience of description, although a case in which light emitting elements LD are aligned in a first direction DR1 is illustrated in FIG. 11, an alignment direction of the light emitting elements LD is not limited thereto. For example, some of the light emitting elements LD may be aligned in a direction oblique to the first direction DR1.

Referring to FIGS. 11 and 12, the pixel PXL in accordance with an embodiment of the present disclosure may include a pixel circuit layer PCL disposed on a substrate SUB and a display element layer DPL disposed on the pixel circuit layer PCL.

The pixel circuit layer PCL may include a plurality of layers. In an embodiment, for example, the pixel circuit layer PCL may include a buffer layer BFL, a gate insulating layer GI, an interlayer insulating layer IL, and a via layer VIAL, which are sequentially disposed on the substrate SUB. The above-described layers may be insulating layers including an organic insulating material or an inorganic insulating material.

Also, the pixel circuit layer PCL may include a plurality of circuit elements constituting the driving circuit (DC shown in FIG. 9A) of the pixel PXL. For example, the pixel circuit layer PCL may include a transistor T. In an embodiment, the transistor T may be the first transistor M1 shown in FIG. 9A, but the present disclosure is not limited thereto.

The buffer layer BFL may prevent or substantially prevent an impurity from being diffused into a circuit element included in the pixel circuit layer PCL. The buffer layer BFL may be provided as a single layer or a multi-layer. When the buffer layer BFL is provided as the multi-layer, layers constituting the multi-layer may be formed of the same material or be formed of different materials. The buffer layer BFL may be omitted according to the material and process conditions of the substrate SUB.

The transistor T may be disposed on the buffer layer BFL. The transistor T may include an active layer ACT, a gate electrode GE, a first transistor electrode TET1, and a second transistor electrode TET2.

The active layer ACT may be disposed between the buffer layer BFL and the gate insulating layer GI. When the pixel circuit layer PCL does not include the buffer layer BFL, the active layer ACT may be disposed between the substrate SUB and the gate insulating layer GI. The active layer ACT may include a first region in contact with the first transistor electrode TET1, a second region connected to the second transistor electrode TET2, and a channel region located between the first and second regions. One of the first and second regions may be a source region, and the other of the first and second regions may be a drain region.

The active layer ACT may be a semiconductor pattern made of poly-silicon, amorphous silicon, oxide semiconductor, etc. In an embodiment, the channel region of the active layer ACT is a semiconductor pattern undoped with an impurity, and may be an intrinsic semiconductor. In an embodiment, each of the first and second regions of the active layer ACT may be a semiconductor pattern doped with a predetermined impurity.

The gate electrode GE may be disposed between the gate insulating layer GI and the interlayer insulating layer IL. The gate electrode GE may overlap with at least a portion of the active layer ACT. The gate electrode GE may be insulated from the active layer ACT by the gate insulating layer GI.

The first and second transistor electrodes TET1 and TET2 may be disposed on the interlayer insulating layer IL. The first and second transistor electrodes TET1 and TET2 may be electrically connected to the active layer ACT. For example, the first and second transistor electrodes TET1 and TET2 may be respectively in contact with the first region and the second region of the active layer ACT through contact holes penetrating the gate insulating layer GI and the interlayer insulating layer IL. In some embodiments, at least one of the first region and the second region of the active layer ACT may serve as one of the first and second transistor electrodes TET1 and TET2. In an example, the first region of the active layer ACT may serve as the first transistor electrode TET1, and the second region of the active layer ACT may serve as the second transistor electrode TET2.

Although not shown in the drawings, one of the first transistor electrode TET1 and the second transistor TET2 may be electrically connected to a first electrode RFE1 which will be described later through a contact hole or a separate connection member, to provide a driving current.

Meanwhile, although a case in which the pixel circuit layer PCL included in the pixel PXL is disposed on the bottom of the display element layer DPL when viewed in a cross-section to overlap with the display element layer DPL is illustrated in the above-described embodiment, the present disclosure is not limited thereto. In some embodiments, the pixel circuit layer PCL may be disposed on the bottom of the display element layer DPL and be provided in a region which does not overlap with the display element layer DPL. In another embodiment, the pixel circuit layer PCL may be disposed on a same layer as the display element layer DPL.

In an embodiment, the display element layer DPL of the pixel PXL may include a first bank BNK1, a second bank BNK2, the first electrode RFE1, a second electrode RFE2, a first insulating layer INS1, a light emitting element LD, a third electrode CTE1, a fourth electrode CTE2, and a second insulating layer INS2.

The display element layer DPL may be disposed on the pixel circuit layer PCL. In an example, the display element layer DPL may be disposed on the via layer VIAL corresponding to an uppermost layer of the pixel circuit layer PCL. In some embodiments, an organic insulating layer or an inorganic insulating layer may be further disposed between the display element layer DPL and the via layer VIAL.

The first bank BNK1 and the second bank BNK2 may be disposed on the via layer VIAL (or the substrate SUB). A space in which the light emitting element LD is disposed may be provided between the first bank BNK1 and the second bank BNK2. In an embodiment, the first bank BNK1 and the second bank BNK2 may be spaced apart from each other along the first direction DR1 by a distance which is equal to or greater than a length of the light emitting element LD. In an embodiment, the first bank BNK1 and the second bank BNK2 may be disposed on a same layer, and have a same height (or thickness). However, the present disclosure is not limited thereto. Also, the first bank BNK1 and the second bank BNK2 may extend along a second direction DR2 intersecting the first direction DR1.

The first bank BNK1 and the second bank BNK2 may be an insulating material including an organic material or an inorganic material, but the material of the first bank BNK1 and the second bank BNK2 is not limited thereto. In an embodiment, each of the first bank BNK1 and the second bank BNK2 may be formed as a single layer. However, the present disclosure is not limited thereto, and each of the first bank BNK1 and the second bank BNK2 may be formed as a multi-layer. In an embodiment, each of the first bank BNK1 and the second bank BNK2 may have a structure in which at least one organic insulating layer and at least one inorganic insulating layer are stacked.

In some embodiments, cross-sections of each of the first bank BNK1 and the second bank BNK2 may have a trapezoidal shape of which side surfaces are inclined at an angle (e.g., a predetermined angle). However, the shape of each of the cross-sections of the first bank BNK1 and the second bank BNK2 is not limited thereto, and each of the cross-sections of the first bank BNK1 and the second bank BNK2 may have any of various shapes, such as a semi-elliptical shape, a circular shape, and a quadrangular shape.

In some embodiments, the first bank BNK1 and the second bank BNK2 may be omitted.

The first electrode RFE1 and the second RFE2 may be respectively disposed over the first bank BNK1 and the second bank BNK2, which correspond thereto. For example, the first electrode RFE1 may be provided over the first bank BNK1, and the second electrode RFE2 may be provided over the second bank BNK2. In some embodiments, when the pixel PXL does not include the first bank BNK1 and the second bank BNK2, the first electrode RFE1 and the second electrode RFE2 may be provided directly on the via layer VIAL.

The first electrode RFE1 and the second electrode RFE2 may be disposed to be spaced apart from each other. The first electrode RFE1 and the second electrode RFE2 may be spaced apart from each other at a distance (e.g., a predetermined distance) along the first direction DR1. In an embodiment, the distance at which the first electrode RFE1 and the second electrode RFE2 are spaced apart from each other may be smaller than the length of the light emitting element LD. When the light emitting element LD is disposed at a central portion between the first electrode RFE1 and the second electrode RFE2, each of at least a portion of the first electrode RFE1 and at least a portion of the second electrode RFE2 may overlap with the light emitting element LD in a third direction DR3. The first electrode RFE1 and the second electrode RFE2 may extend along the second direction DR2 on a plane.

In an embodiment, the distance at which the first electrode RFE1 and the second electrode RFE2 are spaced apart from each other may be greater than the length of the light emitting element LD, and the light emitting element LD may not overlap with the first electrode RFE1 and the second electrode RFE2 in the third direction DR3.

In some embodiments, the first electrode RFE1 or the second electrode RFE2 may be electrically connected to circuit elements included in the pixel circuit layer PCL disposed on the bottom thereof. For example, although not shown in the drawings, the first electrode RFE1 may be electrically connected to the transistor T of the pixel circuit layer PCL through a separate contact hole or connection member, and receive a driving current provided from the transistor T.

In an embodiment, the first electrode RFE1 and the second electrode RFE2 may be disposed with a uniform or substantially uniform thickness along surfaces of the first bank BNK1 and the second bank BNK2. The first electrode RFE1 and the second electrode RFE2 may respectively correspond to the shapes of the first bank BNK1 and the second bank BNK2. For example, the first electrode RFE1 may have a shape corresponding to a gradient of the first bank BNK1, and the second electrode RFE2 may have a shape corresponding to a gradient of the second bank BNK2. In an embodiment, the first electrode RFE1 and the second electrode RFE2 may be concurrently (e.g., simultaneously) formed.

The first electrode RFE1 and the second electrode RFE2 may be made of a conductive material. In an example, each of the first electrode RFE1 and the second electrode RFE2 may include a metal, such as Al, Mg, Ag, Pt, Pd, Au, Ni, Nd, Ir, Cr, Ti, or an alloy thereof. In another example, each of the first electrode RFE1 and the second electrode RFE2 may include a transparent conductive material, such as indium tin oxide (ITO), indium zinc oxide (IZO), zinc oxide (ZnO), or indium tin zinc oxide (ITZO).

However, the material of the first electrode RFE1 and the second electrode RFE2 is not limited to the above-described materials. For example, the first electrode RFE1 and the second electrode RFE2 may include a conductive material having constant reflexibility. When the first electrode RFE1 and the second electrode RFE2 are made of the conductive material having constant reflexibility, lights emitted from a first end portion EP1 and a second end portion EP2 of each light emitting element LD may be reflected by the first electrode RFE1 and the second electrode RFE2, to further advance in the third direction DR3. Accordingly, the light emission efficiency of the display device can be improved.

One of the first electrode RFE1 and the second electrode RFE2 may be an anode, and the other of the first electrode RFE1 and the second electrode RFE2 may be a cathode. For example, the first electrode RFE1 may be the anode, and the second electrode RFE2 may be the cathode. However, the present disclosure is not limited thereto, and, in an embodiment, the first electrode RFE1 may be the cathode, and the second electrode RFE2 may be the anode.

The first electrode RFE1 and the second electrode RFE2 may provide a driving signal (or driving current) to the light emitting element LD, corresponding to a scan signal and a data signal, and the light emitting element LD may emit light with a luminance corresponding to the provided driving signal.

The drawings will be further described in conjunction with FIG. 9A. Each of the first electrode RFE1 and the second electrode RFE2 may be electrically connected to any one of the driving circuit DC and the second driving power source VSS through a separate connection line or connection member. For example, the first electrode RFE1 may be electrically connected to the driving circuit DC, and the second electrode RFE2 may be electrically connected to the second driving power source VSS. Accordingly, the first electrode RFE1 and the second electrode RFE2 can provide the driving signal to the light emitting element LD.

The first insulating layer INS1 may be provided over the first electrode RFE1 and the second electrode RFE2, and the light emitting element LD may be disposed on the first insulating layer INS1.

In an embodiment, the first insulating layer INS1 may be entirely provided on the via layer VIAL, to cover the first electrode RFE1 and the second electrode RFE2, which are described above. In an embodiment, the first insulating layer INS1 may further cover a surface of the via layer VIAL, on which the first electrode RFE1 and the second electrode RFE2 are not disposed. In an embodiment, the first insulating layer INS1 may be an organic insulating layer made of an organic material, but the present disclosure is not limited thereto.

In an embodiment, a groove GRV may be formed in the first insulating layer INS1. The groove GRV may provide a space in which the light emitting element LD is disposed.

The groove GRV of the first insulating layer INS1 will be described in further detail with further reference to FIG. 13. The groove GRV concave in a direction (e.g., the third direction DR3) from an upper surface INS1a of the first insulating layer INS1 toward the via layer VIAL (or the substrate SUB) may be formed in the first insulating layer INS1.

The groove GRV may be formed between the first bank BNK1 and the second bank BNK2, and a width GW of the groove GRV in the first direction DR1 may be equal to the length L (shown, e.g., in FIG. 1) of the light emitting element LD.

In an embodiment, the light emitting element LD may be disposed in the groove GRV formed in the first insulating layer INS1, and be completely in contact with a bottom surface INS1b of the groove GRV. A depth GD of the groove GRV may be smaller than a diameter D of the light emitting element LD. Accordingly, only a portion of the light emitting element LD may be disposed in the groove GRV.

In some embodiments, at least a portion of the first end portion EP1 of the light emitting element LD and at least a portion of the second end portion EP2 of the light emitting element LD may be in contact with the first insulating layer INS1. For example, as shown in FIG. 13, a portion of the first end portion EP1 of the light emitting element LD may be in contact with a side surface INS1c of the groove GRV of the first insulating layer INS1. Another portion of the first end portion EP1 and another portion of the second end portion EP2, which are not in contact with the first insulating layer INS1, may be exposed to the outside, and be respectively in contact with the third electrode CTE1 and the fourth electrode CTE2, which will be described later. In some embodiments, a front surface of the first end portion EP1 and a front surface of the second end portion EP2 may be in contact with the side surface INS1c and another side surface of the groove GRV, respectively.

Since the light emitting element LD is disposed in the groove of the first insulating layer INS1, a failure can be minimized or reduced, in which the light emitting element LD is separated to the outside or is moved to an unintended position in a procedure of performing a subsequent process after a process of aligning (or disposing) the light emitting element LD. That is, the process reliability of the display device can be improved. Further, a separate fixing member for fixing the light emitting element LD is not formed, and, thereby, the manufacturing cost can be reduced.

The insulating layer INS1 may include a first opening OP1 and a second opening OP2. The first opening OP1 and the second opening OP2 may expose at least a portion of the first electrode RFE1 and the second electrode RFE2.

The first opening OP1 and the second opening OP2 may be formed to respectively overlap with the first electrode RFE1 and the second electrode RFE2, which correspond thereto. For example, the first opening OP1 may be formed to overlap with the first electrode RFE1, and the second opening OP2 may be formed to overlap with the second electrode RFE2.

The first opening OP1 and the second opening OP2 may have a thickness and/or a depth, corresponding to a thickness of the first insulating layer INS1. That is, the first opening OP1 and the second opening OP2 may completely penetrate the first insulating layer INS in a corresponding region. Accordingly, portions of the first electrode RFE1 and the second electrode RFE2 may be exposed to the outside to be in contact with the third electrode CTE1 and the fourth electrode CTE2, which will be described later.

The third electrode CTE1 (or first contact electrode) and the fourth electrode CTE2 (or second contact electrode) may be provided on the first insulating layer INS1 and the light emitting element LD.

Each of the third electrode CTE1 and the fourth electrode CTE2 may be in contact with one of the first end portion EP1 and the second end portion EP2 of the light emitting element LD. For example, the third electrode CTE1 may be in contact with the first end portion EP1 of each light emitting element LD, and the fourth electrode CTE2 may be in contact with the second end portion EP2 of each light emitting element LD.

In some embodiments, the third electrode CTE1 may be in contact with a portion of the first end portion EP1 which is not in contact with the first insulating layer INS1 but is exposed, and the fourth electrode CTE2 may be in contact with a portion of the second end portion EP2 which is not in contact with the first insulating layer INS1 but is exposed.

When viewed on a plane, the third electrode CTE1 may cover at least a portion of the first electrode RFE1. The third electrode CTE1 may be electrically connected to the first electrode RFE1 through the first opening OP1 of the first insulating layer INS1. That is, the third electrode CTE1 may be in contact with the first end portion EP1 of the light emitting element LD and the first electrode RFE1.

When viewed on a plane, the fourth electrode CTE2 may cover at least a portion of the second electrode RFE2. The fourth electrode CTE2 may be electrically connected to the second electrode RFE2 through the second opening OP2 of the first insulating layer INS1. That is, the fourth electrode CTE2 may be in contact with the second end portion EP2 of the light emitting element LD and the second electrode RFE2.

In an embodiment, each of the third electrode CTE1 and the fourth electrode CTE2 may be made of a transparent conductive material. For example, the transparent conductive material may include any of ITO, IZO, ITZO, and the like. When the third electrode CTE1 and the fourth electrode CTE2 are made of the transparent conductive material, light loss can be reduced when light emitted from the light emitting element LD advances in the third direction DR3. However, the material of the third electrode CTE1 and the fourth electrode CTE2 is not limited to the above-described materials.

In some embodiments, the third electrode CTE1 and the fourth electrode CTE2 may be concurrently (e.g., simultaneously) formed in the same process. Accordingly, a manufacturing process of the display device can be simplified, and the manufacturing cost of the display device can be reduced. However, the present disclosure is not limited thereto.

The second insulating layer INS2 may be disposed over the light emitting element LD, the third electrode CTE1, and the fourth electrode CTE2. In an embodiment, the second insulating layer INS2 may include an inorganic insulating layer made of an inorganic material. In an embodiment, the second insulating layer INS2 may be formed as a single layer. However, the present disclosure is not limited thereto, and, in an embodiment, the second insulating layer INS may include a multi-layered structure. In an embodiment, when the second insulating layer INS2 includes the multi-layered structure, the second insulating layer INS2 may further include an organic insulating layer made of an organic material, and include a multi-layered structure in which an organic insulating layer and an inorganic insulating layer are alternately disposed.

The second insulating layer INS2 may serve as an encapsulation layer which prevents or substantially prevents the third electrode CTE1, the fourth electrode CTE2, and the light emitting element LD from being damaged in the manufacturing process of the display device, and prevents or substantially prevents penetration of oxygen and/or moisture.

Although not shown in the drawings, the pixel PXL may further include a partition wall disposed to surround each pixel PXL. The partition wall may be a pixel defining layer which defines a light emission region of the pixel PXL. The partition wall may include at least one light blocking material and/or at least one reflective material, to prevent or substantially prevent occurrence of a light leakage defect in which light is leaked between adjacent pixels. Also, the partition wall may prevent or substantially prevent a solution including the light emitting element LD from being leaked to an adjacent pixel in a process of aligning the light emitting element. The partition wall may be omitted according to a process condition, etc., of the display device.

Herein, some other embodiments of the present disclosure will be described. In the following embodiments, components which are the same as those of the above-described embodiment are designated by like reference numerals, and descriptions thereof may be omitted or simplified. In addition, portions different from those of the above-described embodiment will be mainly described.

Figure 14:
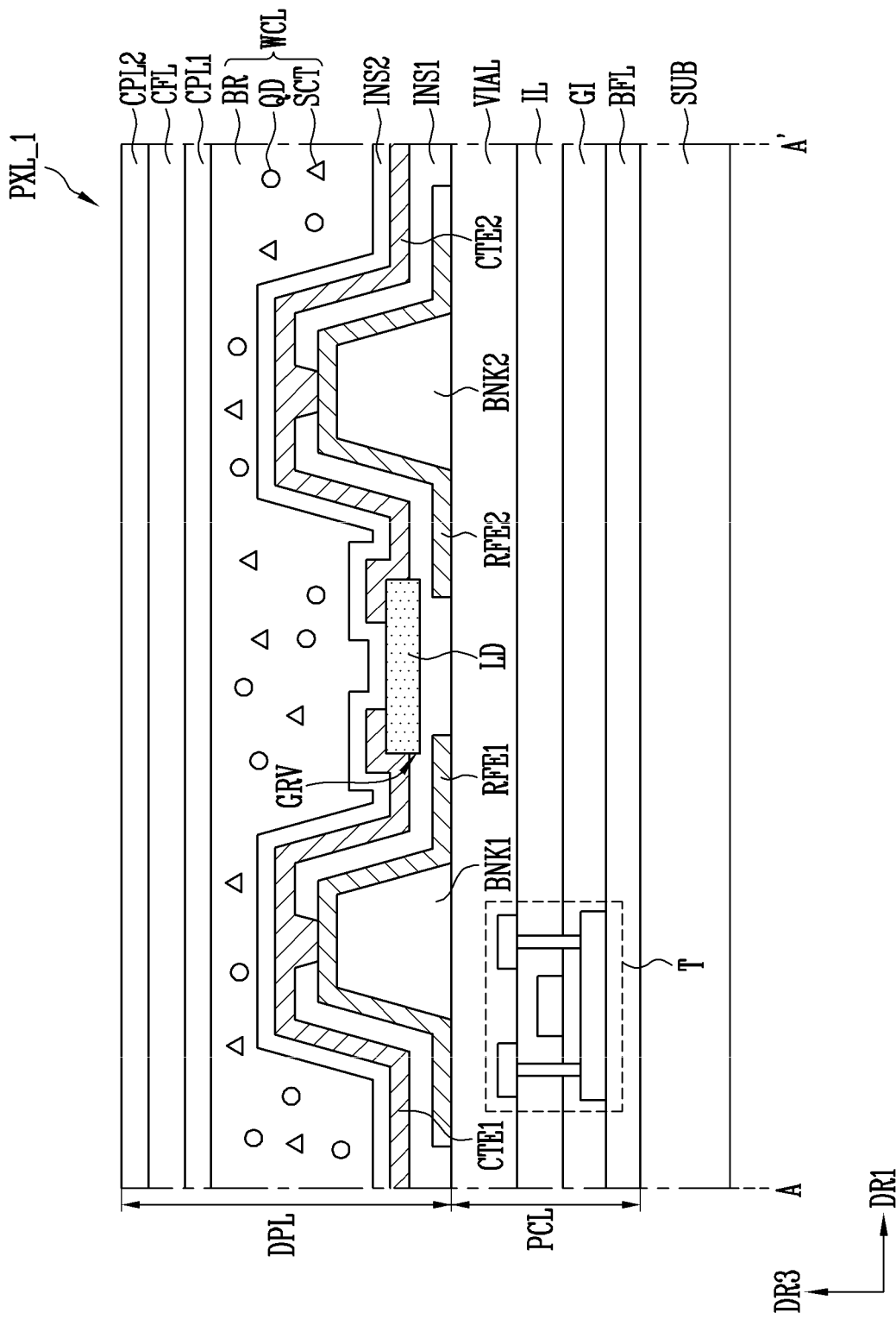
FIG. 14 is a cross-sectional view illustrating another example of the pixel included in the display device shown in FIG. 8.

FIG. 14 is a cross-sectional view illustrating another example of the pixel included in the display device shown in FIG. 8. The embodiment shown in FIG. 14 is different from the embodiment shown in FIG. 12 in that the display element layer DPL further includes a wavelength conversion layer WCL and a color filter layer CFL, and the other components are substantially the same as or similar to those of the embodiment shown in FIG. 12.

Referring to FIGS. 12 and 14, a pixel PXL_1 may further include the wavelength conversion layer WCL and the color filter layer CFL.

The wavelength conversion layer WCL may be disposed on the second insulating layer INS2. The wavelength conversion layer WCL may include a base layer BR, and a wavelength conversion particle QD and a scattering particle SCT, which are dispersed in the base layer BR. The base layer BR is not particularly limited as long as it is a material which has high light transmittance and has an excellent dispersion characteristic with respect to the wavelength conversion particle QD and the scattering particle SCT. For example, the base layer BR may include an organic material such as an epoxy-based resin, an acryl-based resin, a cardo-based resin, or an imide-based resin.

The wavelength conversion particle QD may convert a peak wavelength of incident light into another specific peak wavelength. That is, the wavelength conversion particle QD may convert a color of incident light into another color.

For example, when the light emitting element emits blue light, the wavelength conversion particle QD may convert the blue light provided from the light emitting element LD into another color light and emit the another color light. For example, the wavelength conversion particle QD may convert the blue light provided from the light emitting element LD into red light or green light and emit the red light or green light.

Examples of the wavelength conversion particle QD may be quantum dots, quantum rods, phosphors, and the like. The quantum dot may be a particle material which emits light having a specific wavelength, while electrons are transferred from a conduction band to a valence band.

The quantum dots may be semiconductor nanocrystalline materials. The quantum dots have a specific band gap depending on their composition and size, and may emit light having an inherent band after absorbing light. Examples of the semiconductor nanocrystals of the quantum dots may include a group IV based nanocrystal, a group II-VI based compound nanocrystal, a group III-V based compound nanocrystal, a group IV-VI based nanocrystal, or a combination thereof.

For example, the group IV based nanocrystal may include a dyadic compound, such as silicon (Si), germanium (Ge), silicon carbide (SiC), and silicon-germanium (SiGe). However, the present disclosure is not limited thereto.

Further, the group II-VI compound nanocrystals may include any of dyadic compounds, such as CdSe, CdTe, ZnS, ZnSe, ZnTe, ZnO, HgS, HgSe, HgTe, MgSe, MgS, mixtures thereof, and/or the like; triad compounds, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, mixtures thereof, and/or the like; and tetrad compounds, such as HgZnTeS, CdZnSeS, CdZnSeTe, CdZnSTe, CdHgSeS, CdHgSeTe, CdHgSTe, HgZnSeS, HgZnSeTe, HgZnSTe, mixtures thereof, and/or the like. However, the present disclosure is not limited thereto.

In addition, the group III-V compound nanocrystals may include any of dyadic compounds, such as GaN, GaP, GaAs, GaSb, AlN, AlP, AlAs, AlSb, InN, InP, InAs, InSb, mixtures thereof, and/or the like; triad compounds, such as GaNP, GaNAs, GaNSb, GaPAs, GaPSb, AlNP, AlNAs, AlNSb, AlPAs, AlPSb, InGaP, InNP, InNAs, InNSb, InPAs, InPSb, mixtures thereof, and/or the like; or tetrad compounds, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, mixtures thereof, and/or the like. However, the present disclosure is not limited thereto.

The group IV-VI nanocrystals may include any of dyadic compounds, such as SnS, SnSe, SnTe, PbS, PbSe, PbTe, mixtures thereof, and/or the like; triad compounds, such as SnSeS, SnSeTe, SnSTe, PbSeS, PbSeTe, PbSTe, SnPbS, SnPbSe, SnPbTe, mixtures thereof, and/or the like; or tetrad compounds, such as SnPbSSe, SnPbSeTe, SnPbSTe, mixtures thereof, and/or the like. However, the present disclosure is not limited thereto.

The form of the quantum dots is not particularly limited, and may be a form generally used in the art. Examples of the form of the quantum dots may be spherical, pyramidal, multi-arm type or cubic type nanoparticles, a nanotube, a nanowire, a nano fiber, a nanoplate-like particle and the like. The dyadic compounds, the triad compounds, or the tetrad compounds, which are described above, may be present in the particle at a uniform concentration, or be present in the same particle by being divided into a state in which the concentration distribution is partially different.

In an embodiment, the quantum dots may have a core-shell structure, which includes a core including the above-described nanocrystals and a shell surrounding the core. The interface between the core and shell has a gradient in which the concentration of an element existing in the shell is lowered as approaching the center of the shell. The shell of the quantum dots may serve as a protective layer for preventing or reducing the chemical denaturation of the core to maintain semiconductor characteristics and/or a charging layer for imparting electrophoretic characteristics to the quantum dots. The shell may be a single layer or a multi-layer structure. As an example, a metal or non-metal oxide, a semiconductor compound, a combination thereof, and/or the like may be adopted as the shell of the quantum dots.

For example, the above-described metal or nonmetal oxide may include a dyadic compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and/or the like; or triad compounds, such as $MgAl_2O_4$, $CoFe_2O_4$, $NiFe_2O_4$, $CoMn_2O_4$, and/or the like. However, the present disclosure is not limited thereto.

Further, the above-described semiconductor compound may include CdS, CdSe, CdTe, ZnS, ZnSe, ZnTe, GaAs, GaP, GaSb, HgS, HgSe, HgTe, InAs, InP, InSb, AlAs, AlP, AlSb, and/or the like. However, the present disclosure is not limited thereto.

In an embodiment, the light emitted by the above-described quantum dot may have a full width of half maximum (FWHM) of the light-emitting wavelength spectrum of about 45 nm or less, thereby further improving the color purity and the color reproducibility of a color displayed by the display device. Further, the light emitted by the quantum dot may be emitted in various directions regardless of the incident angle of the incident light. Accordingly, the side visibility of the display device can be improved.

The scattering particle SCT may have a refractive index different from that of the wavelength conversion layer WCL, and form an optical interface with the wavelength conversion layer WCL. The scattering particle SCT is not particularly limited so long as it is made of a material capable of scattering at least some of transmitted lights. In an embodiment, for example, the scattering particle SCT may be a particle made of a material such as titanium oxide ($TiO_2$), aluminum oxide ($Al_2O_3$), indium oxide ($In_2O_3$), zinc oxide (ZnO), tin oxide ($SnO_2$), or silica.

The scattering particle SCT may scatter light in several directions irrespective of the incident direction of incident light, without substantially converting the wavelength of the light transmitted through the wavelength conversion layer WCL. Accordingly, the side visibility of the display device can be improved.

A first capping layer CPL1 may be disposed on the wavelength conversion layer WCL. The first capping layer CPL1 may be an inorganic insulating layer made of an inorganic material. In an embodiment, the first capping layer CPL1 may serve as an encapsulation layer which entirely covers the wavelength conversion layer WCL to prevent or substantially prevent oxygen and/or moisture from the outside from penetrating into the wavelength conversion layer WCL. Accordingly, the wavelength conversion layer WCL may be encapsulated by the second insulating layer INS2 and the first capping layer CPL1.

The color filter layer CFL may be disposed on the first capping layer CPL1. The color filter layer CFL may be an absorption type filter which allows light of a specific color to be selectively transmitted therethrough, and can block advancement of light of another color by absorbing the light.

A second capping layer CPL2 may be disposed on the color filter layer CFL. The second capping layer CPL2 may be an inorganic insulating layer made of an inorganic material. In an embodiment, the second capping layer CPL2 may serve as an encapsulation layer which entirely covers the color filter layer CFL, to prevent or substantially prevent oxygen and/or moisture from the outside from penetrating into the color filter layer CFL. Accordingly, the color filter layer CFL may be encapsulated by the first capping layer CPL1 and the second capping layer CPL2.

In some embodiments, at least one of the wavelength conversion layer WCL, the first capping layer CPL1, the color filter layer CFL, and the second capping layer CPL2 may be omitted.

Although a structure in which the wavelength conversion layer WCL and the color filter layer CFL are formed (e.g., directly) on the substrate SUB is illustrated in the embodiment shown in FIG. 14, the present disclosure is not limited thereto. In some embodiments, the wavelength conversion layer WCL and the color filter layer CFL may be formed on a separate substrate different from the substrate SUB on which the light emitting element LD is disposed. The substrate on which the wavelength conversion layer WCL and the color filter layer CFL are formed may face the substrate SUB on which the light emitting element LD is disposed.

Figure 15:
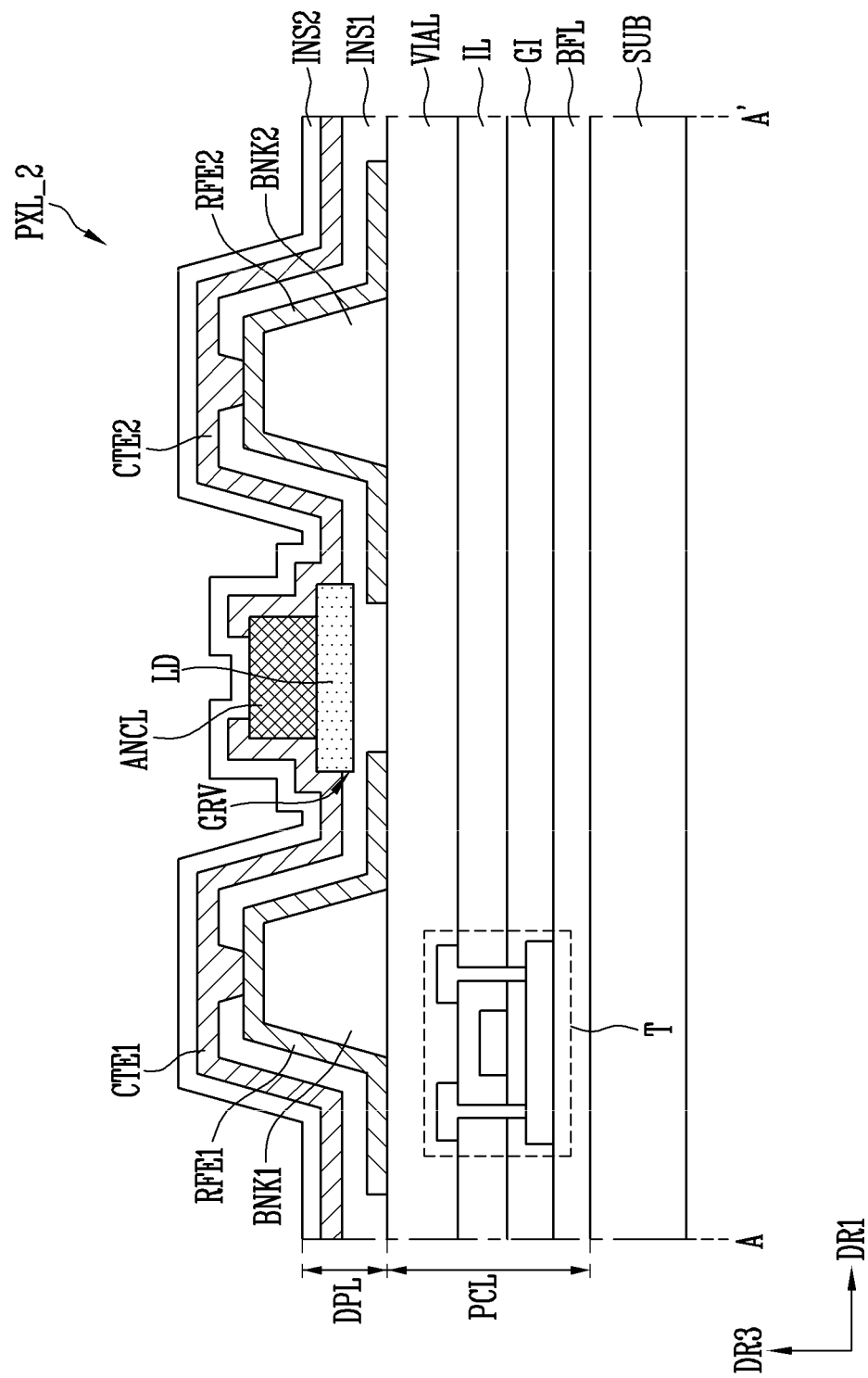
FIG. 15 is a cross-sectional view illustrating another example of the pixel included in the display device shown in FIG. 8.

FIG. 15 is a cross-sectional view illustrating another example of the pixel included in the display device shown in FIG. 8. The embodiment shown in FIG. 15 is different from the embodiment shown in FIG. 12 in that the display element layer DPL further includes a fixed layer ANCL disposed on the light emitting element LD, and the other components are substantially the same as or similar to those of the embodiment shown in FIG. 12.

Referring to FIGS. 12 and 15, a pixel PXL_2 may further include the fixed layer ANCL.

The fixed layer ANCL is disposed on the light emitting element LD, and may stably support and fix the light emitting element LD. The fixed layer ANCL may be an inorganic insulating layer including an inorganic material or an organic insulating layer including an organic material. The fixed layer ANCL may cover at least a portion of an outer circumference of the light emitting element LD, and be formed to expose the first end portion EP1 and the second end portion EP2 of the light emitting element LD. Accordingly, the fixed layer ANCL can prevent or substantially prevent the light emitting element LD from being separated from the first insulating layer INS1.

FIGS. 16 to 22 are cross-sectional views illustrating (e.g., sequentially illustrating) a manufacturing method of the display device in accordance with an embodiment of the present disclosure. In particular, FIGS. 16 to 22 are views illustrating the structure shown in FIGS. 11 and 12.

The manufacturing method of the display device in accordance with an embodiment of the present disclosure is sequentially described with further reference to FIGS. 16 to 22 in conjunction with the embodiment described in FIGS. 11 and 12. In FIGS. 16 to 22, a pixel circuit layer PCL is briefly illustrated for convenience of description. However, the pixel circuit layer PCL may be the same as the pixel circuit layer PCL shown in FIG. 12.

Figure 16:
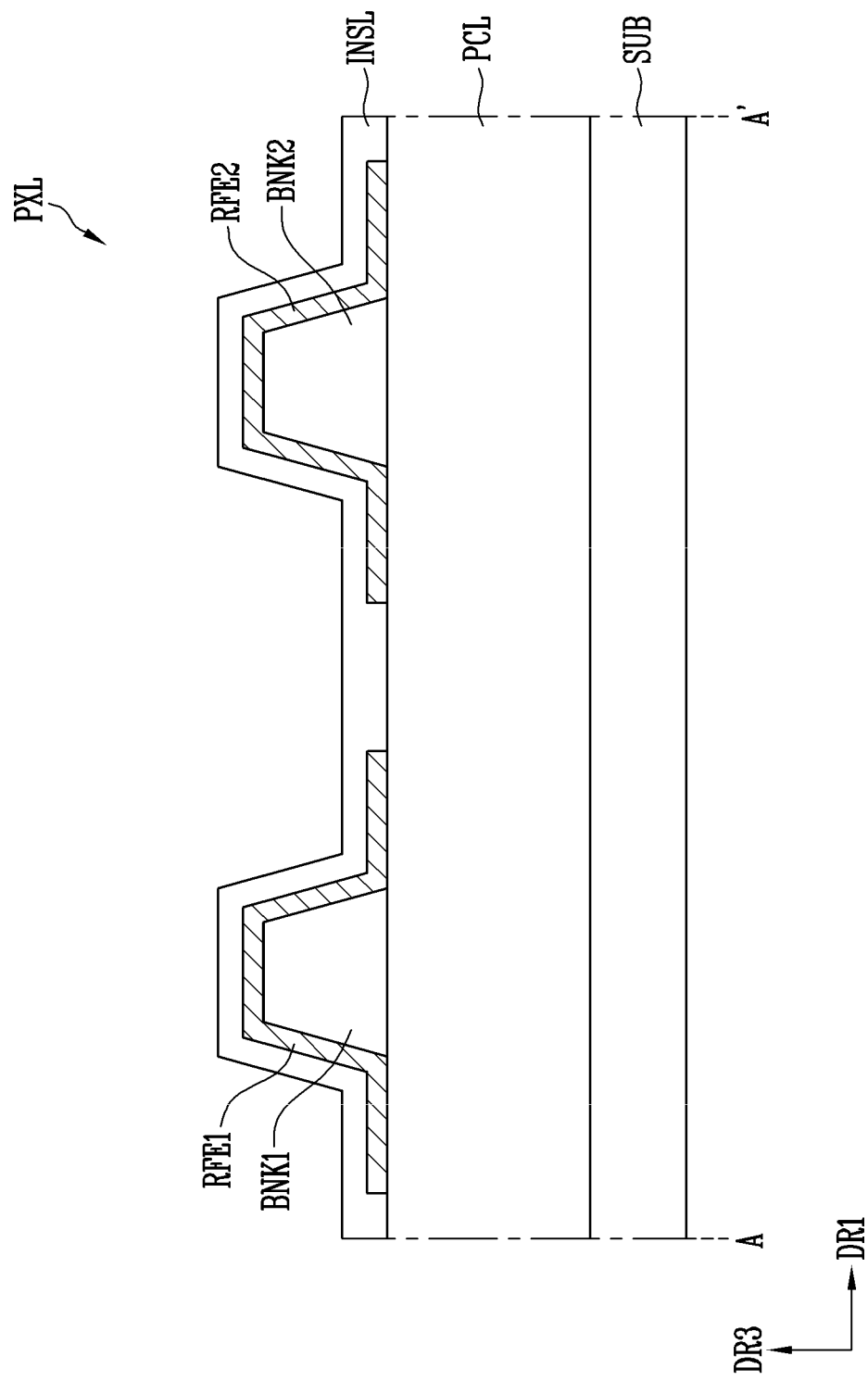
FIGS. 16 to 22 are cross-sectional views illustrating a manufacturing method of a display device in accordance with an embodiment of the present disclosure.

First, as shown in FIG. 16, a first bank BNK1, a second bank BNK2, a first electrode RFE1, and a second electrode RFE2 may be formed on a substrate SUB (or a pixel circuit layer PCL), and an insulating material layer INSL may be formed over the first electrode RFE1 and the second electrode RFE2.

The first bank BNK1 and the second bank BNK2 may be an insulating material including an organic material or an inorganic material, and, in an embodiment, cross-sections of each of the first bank BNK1 and the second bank BNK2 may have a trapezoidal shape of which side surfaces are inclined at an angle (e.g., a predetermined angle). In some embodiments, the first bank BNK1 and the second bank BNK2 may be omitted.

The first electrode RFE1 may be formed over the first bank BNK1, and the second electrode RFE2 may be formed over the second bank BNK2. In an embodiment, the first electrode RFE1 and the second electrode RFE2 may be concurrently (e.g., simultaneously) formed, and be formed of the same material.

In an embodiment, each of the first electrode RFE1 and the second electrode RFE2 may be formed of a metal, such as Al, Mg, Ag, Pt, Pd, Au, Ni, Nd, Ir, Cr, Ti, or an alloy thereof. In another embodiment, each of the first electrode RFE1 and the second electrode RFE2 may be formed of a transparent conductive material, such as indium tin oxide (ITO), indium zinc oxide (IZO), zinc oxide (ZnO), or indium tin zinc oxide (ITZO).

The insulating material layer INSL may be formed over the first electrode RFE1 and the second electrode RFE2. In an embodiment, the insulating material layer INSL may be an organic insulating layer made of an organic material, but the present disclosure is not limited thereto. In an embodiment, the insulating material layer INSL may be entirely provided on the substrate SUB, to cover the first electrode RFE1 and the second electrode RFE2 and to prevent or substantially prevent oxygen and moisture from penetrating into the first electrode RFE1 and the second electrode RFE2.

Figure 17:
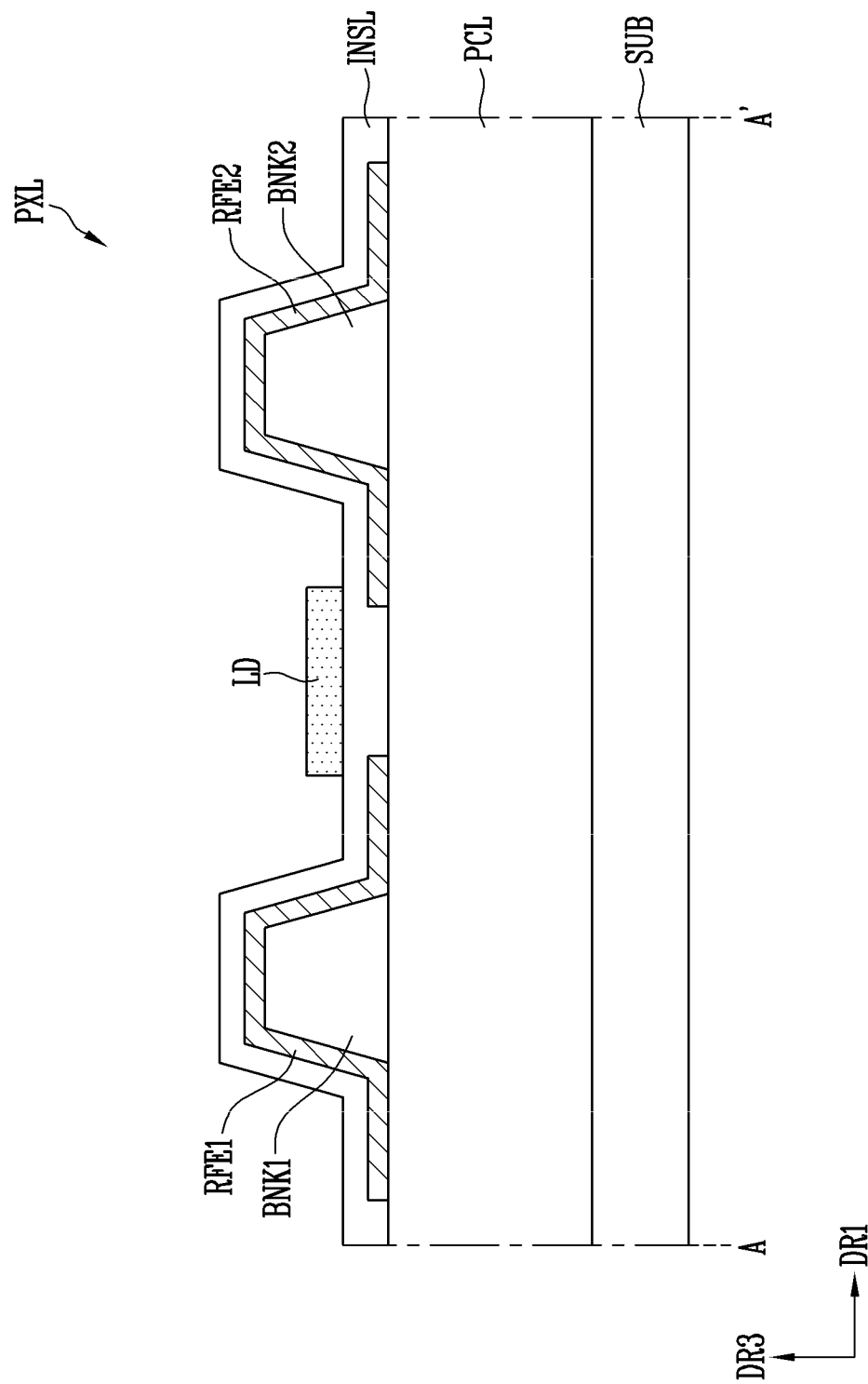

Next, as shown in FIG. 17, a light emitting element LD may be aligned on the insulating material layer INSL. The light emitting element LD may be aligned between the first electrode RFE1 and the second electrode RFE2.

In an embodiment, before the light emitting element LD is disposed, an alignment voltage may be applied to the first electrode RFE1 and the second electrode RFE2. For example, an AC voltage (e.g., a predetermined AC voltage) may be applied to the first electrode RFE1, and a ground voltage may be applied to the second electrode RFE2. Accordingly, an electric field may be formed between the first electrode RFE1 and the second electrode RFE2.

In an embodiment, in the state in which the electric field is formed between the first electrode RFE1 and the second electrode RFE2, light emitting elements LD may be injected onto the insulating material layer INSL by using an inkjet printing process. A self-alignment of the light emitting elements LD may be induced due to the electric field formed between the first electrode RFE1 and the second electrode RFE2. Accordingly, the light emitting elements LD may be aligned in a direction between the first electrode RFE1 and the second electrode RFE2. For example, the light emitting elements LD may be aligned such that a length direction of the light emitting element LD corresponds to the first direction DR1.

Figure 18:
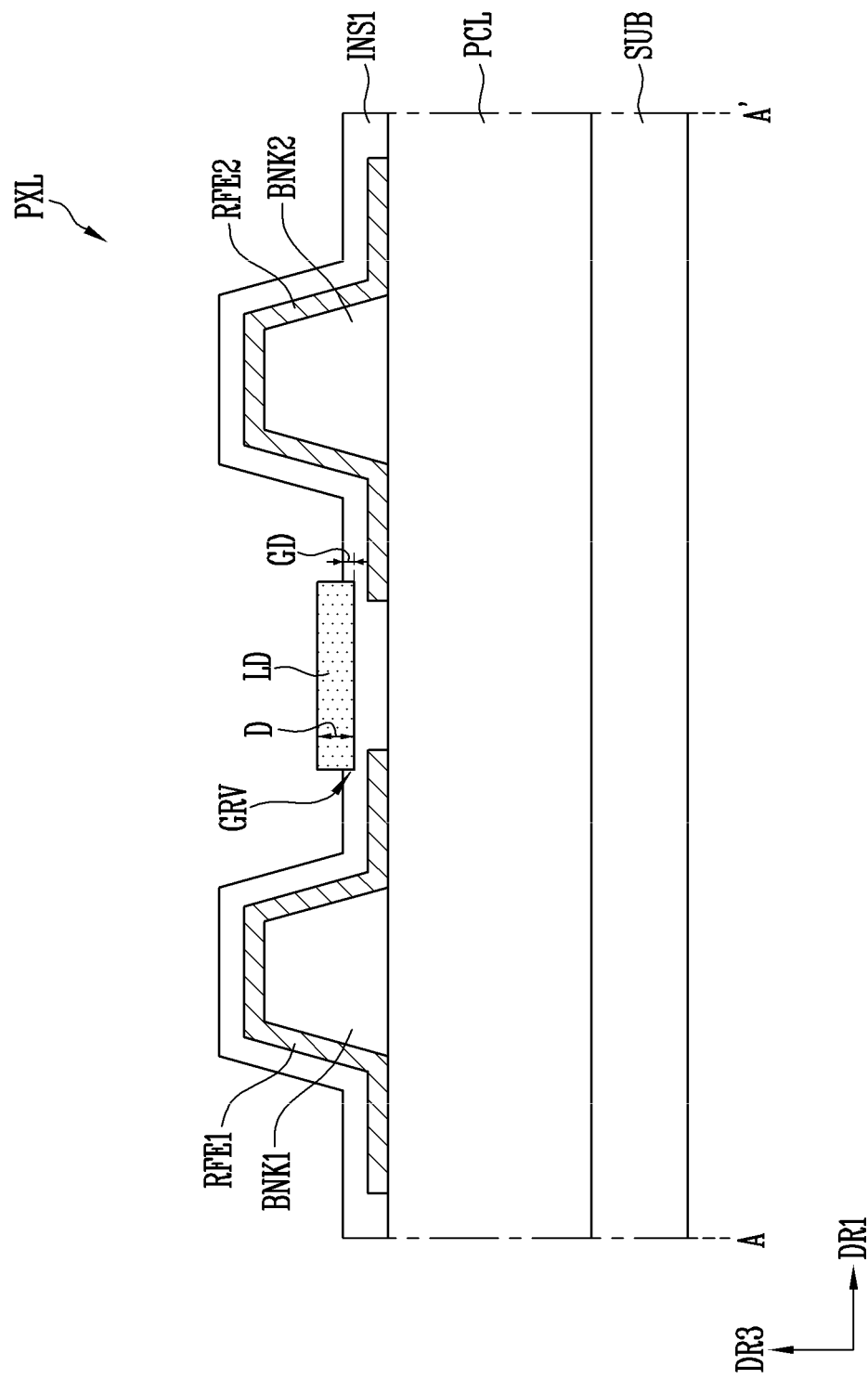

Next, as shown in FIG. 18, a first insulating layer INS1 may be formed by curing the insulating material layer INSL.

In an embodiment, the curing process may be a process of purifying and stabilizing the insulating material layer INSL. In an embodiment, for example, the curing process may be a process of applying heat to the insulating material layer INSL at a certain temperature or more for a certain time or more.

The shape of the insulating material layer INSL may be partially changed by the curing process. In an embodiment, for example, the insulating material layer INSL may reflow due to the curing process, and the shape of at least a portion of the insulating material layer INSL may be changed when the insulating material layer INSL reflows.

Since the insulating material layer INSL reflows, the light emitting element LD disposed on the insulating material layer INSL may be moved toward the substrate (e.g., a direction opposite to the third direction DR3) due to the weight of the light emitting element LD. That is, a portion of the light emitting element LD may be buried in the insulating material layer INSL.

Accordingly, a groove GRV may be formed in the first insulating layer INS1 formed by the curing process, and the light emitting element LD may be disposed in the groove GRV. A depth GD of the groove GRV may be smaller than a diameter D of the light emitting element LD, and only a portion of the light emitting element LD may be buried in the first insulating layer INS1.

An outer circumference of the light emitting element LD may be in contact with a bottom surface of the groove GRV, and a portion of a first end portion of the light emitting element LD and a portion of a second end portion of the light emitting element LD may be in contact with a side surface of the groove GRV. Accordingly, the light emitting element LD may be fixed by the first insulating layer INS1.

Figure 19:
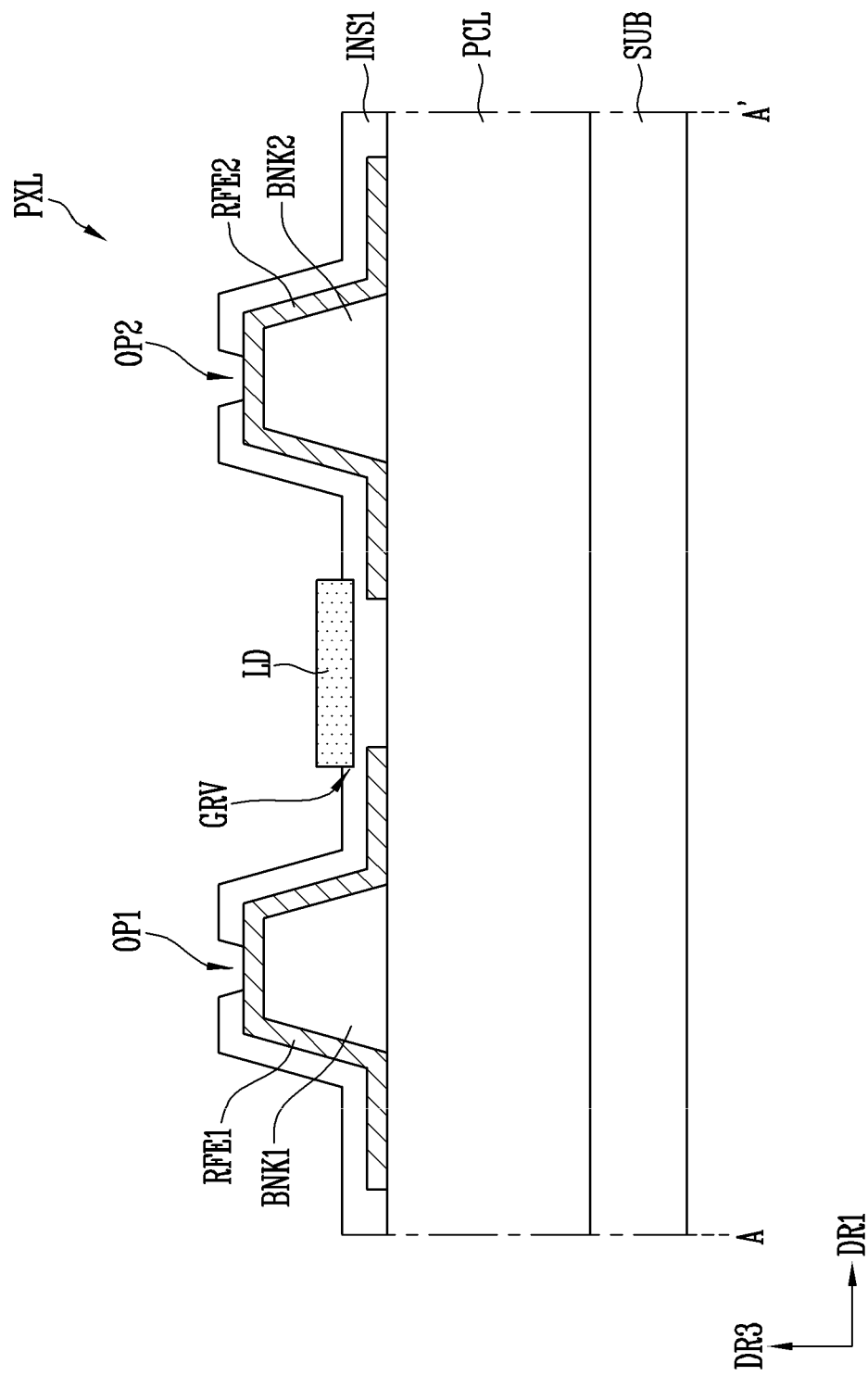

Next, as shown in FIG. 19, a first opening OP1 and a second opening OP2 may be formed, which penetrate the first insulating layer INS1.

The first opening OP1 may penetrate the first insulating layer INS1 and expose a portion of the first electrode RFE1. The second opening OP2 may penetrate the first insulating layer INS1 and expose a portion of the second electrode RFE2. The first opening OP1 and the second opening OP2 may have a thickness and/or a depth corresponding to a thickness of the first insulating layer INS1. In some embodiments, the process of forming the first opening OP1 and the second opening OP2 may be performed before the curing process after the light emitting elements LD are aligned.

Figure 20:
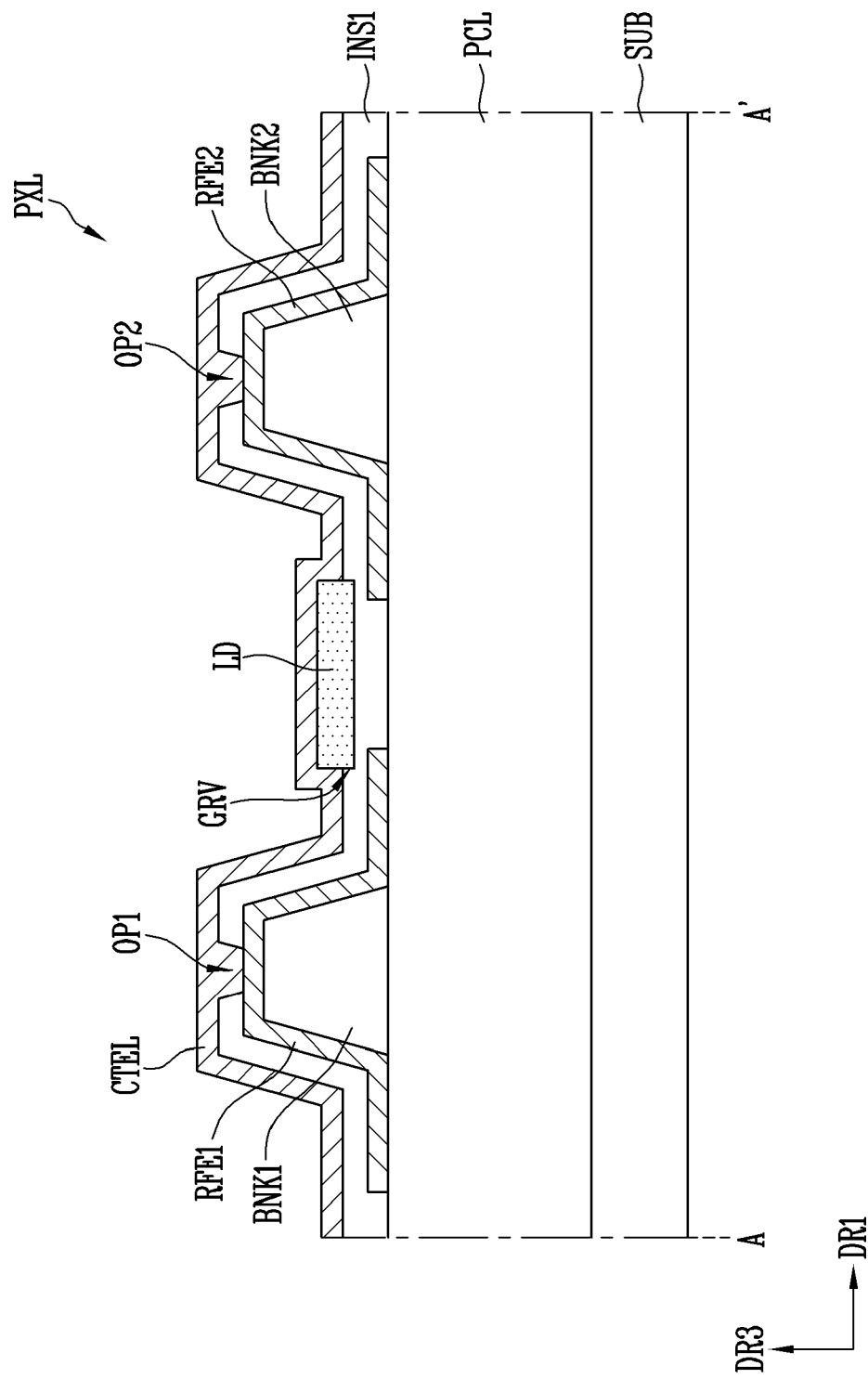
Figure 21:
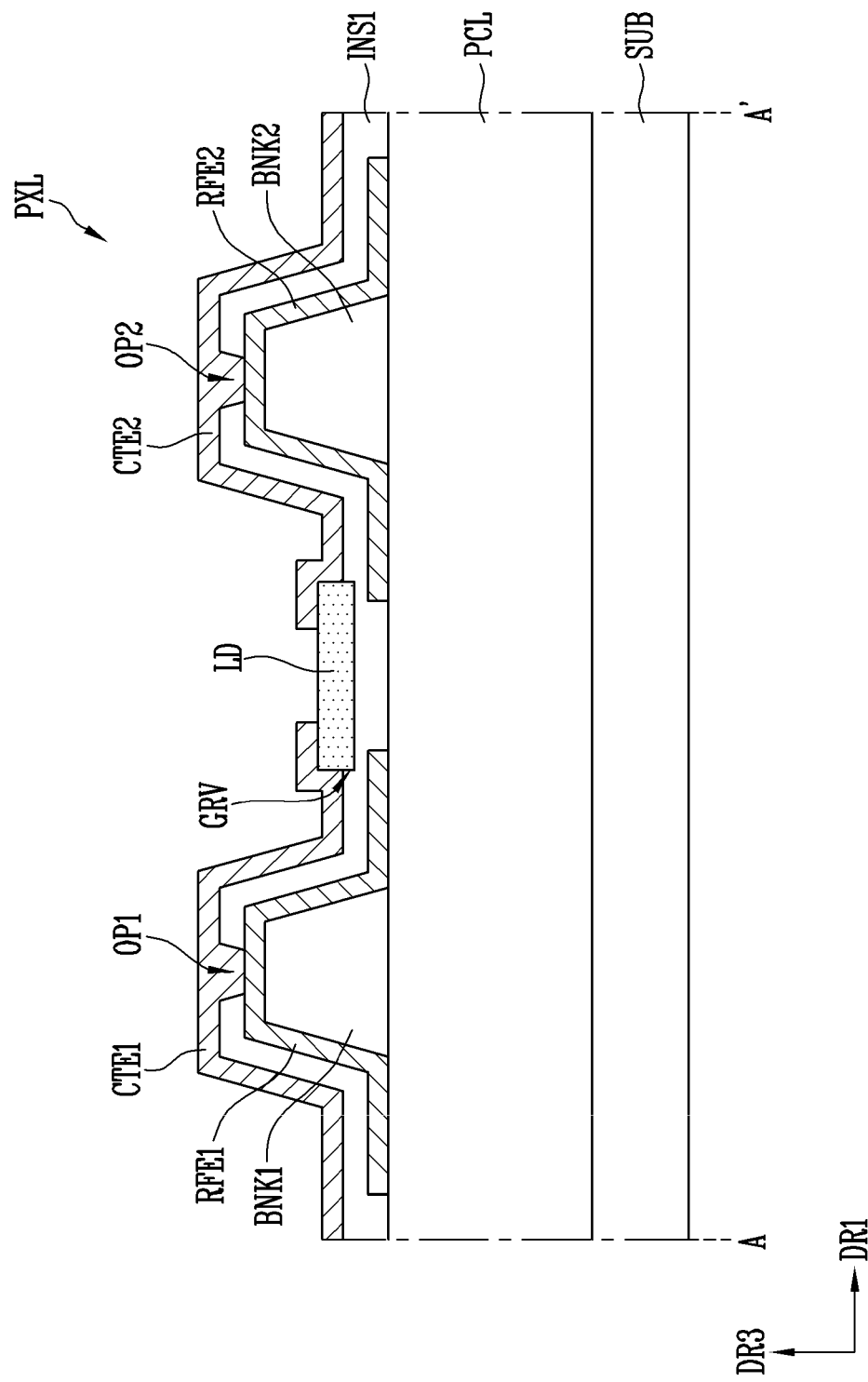

Next, as shown in FIGS. 20 and 21, a conductive material layer CTEL may be formed on the first insulating layer INS1, and a third electrode CTE1 and a fourth electrode CTE2 may be formed by patterning a portion of the conductive material layer CTEL.

In an embodiment, the conductive material layer CTEL may be entirely formed on the first insulating layer INS1 and the light emitting element LD. The conductive material layer CTEL may be made of a transparent conductive material so as to minimize loss of light emitted from the light emitting element LD. For example, the conductive material layer CTEL may be formed of ITO, IZO, ITZO, or the like as the transparent conductive material, but the present disclosure is not limited thereto.

A region in which the conductive material layer CTEL is patterned and removed may be a region overlapping with the light emitting element LD. Although not shown in the drawing, the removed region of the conductive material layer CTEL may extend along the second direction intersecting the first direction DR1 and the third direction DR3. Accordingly, the third electrode CTE1 and the fourth electrode CTE2, which are physically spaced apart from each other, may be formed by patterning the conductive material layer CTEL.

The third electrode CTE1 may be in contact with the first electrode RFE1 through the first opening OP1. Also, the third electrode CTE1 may be in contact with a portion of the first end portion of the light emitting element LD. Accordingly, the third electrode CTE1 may electrically connect the first end portion of the light emitting element LD and the first electrode RFE1.

The fourth electrode CTE2 may be in contact with the second electrode RFE2 through the second opening OP2. Also, the fourth electrode CTE2 may be in contact with a portion of the second end portion of the light emitting element LD. Accordingly, the fourth electrode CTE2 may electrically connect the second end portion of the light emitting element LD and the second electrode RFE2.

Figure 22:
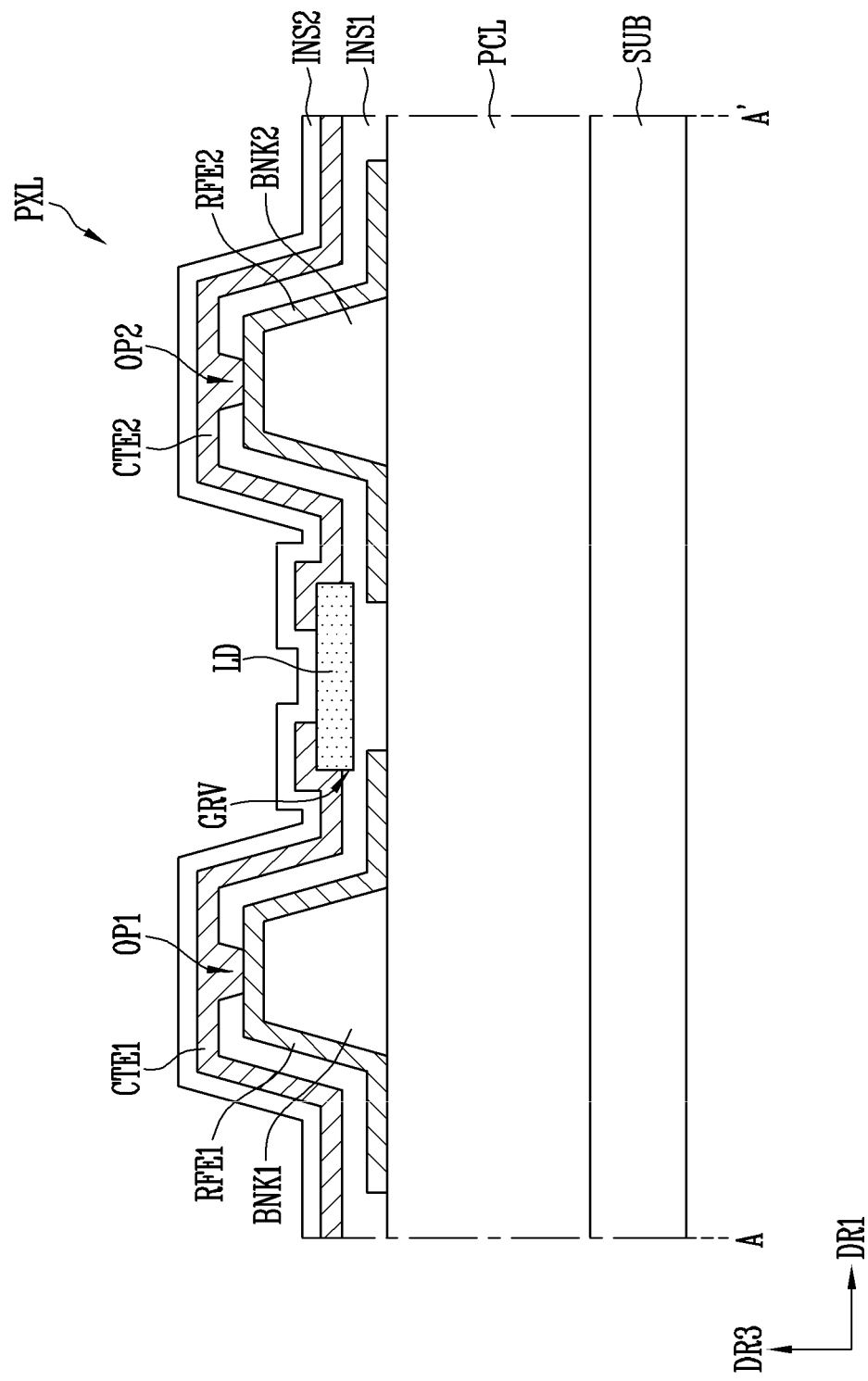

Next, as shown in FIG. 22, a second insulating layer INS2 may be formed over the light emitting element LD, the third electrode CTE1, and the fourth electrode CTE2. The second insulating layer INS2 may be formed as an inorganic insulating layer made of an inorganic material, and cover the light emitting element LD, the third electrode CTE1, and the fourth electrode CTE2. Accordingly, the second insulating layer INS2 may serve as an encapsulation layer which prevents or substantially prevents the third electrode CTE1, the fourth electrode CTE2, and the light emitting element LD from being damaged in the manufacturing process of the display device, and prevents or substantially prevents penetration of oxygen and/or moisture.

As described above, when a portion of the light emitting element LD is buried in and fixed to the first insulating layer INS, a separate fixing member for fixing the light emitting element LD onto the first insulating layer INS1 is not formed, so that the manufacturing cost of the display device can be reduced. Further, the light emitting element LD can be disposed at a desired position, and, thus, the reliability of the display device can be improved.

In accordance with an aspect of the present disclosure, there may be provided a display device and a manufacturing method thereof, in which a light emitting element is buried in and fixed to an organic layer disposed on the bottom thereof, without any separate fixing member, such that manufacturing cost can be reduced and reliability can be improved.

Some example embodiments have been disclosed herein, and, although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it is to be understood by those of skill in the art that various changes in form and details may be made without departing from the spirit and scope of the present disclosure as set forth in the following claims.

What is claimed is:

1. A display device comprising:
a substrate;
a first electrode and a second electrode on the substrate, the first electrode and the second electrode being arranged on a same layer to be spaced apart from each other;
a first insulating layer on the first electrode and the second electrode; and
a light emitting element on the first insulating layer, the entirety of the light emitting element overlaps with the first insulating layer,
wherein the first insulating layer defines a groove concave toward the substrate,
wherein the light emitting element is in the groove, and
wherein an upper portion of the groove is lower than an upper surface of the light emitting element, and is higher than a lower surface of the light emitting element.

2. The display device of claim 1, wherein the light emitting element comprises a first end portion and a second end portion which face away from each other, and
wherein a side surface of the groove of the first insulating layer is in contact with at least a portion of the first end portion and at least a portion of the second end portion.

3. The display device of claim 2, further comprising:
a third electrode electrically connecting the first electrode and the first end portion of the light emitting element; and
a fourth electrode electrically connecting the second electrode and the second end portion of the light emitting element.

4. The display device of claim 3, wherein the first insulating layer comprises a first opening exposing a portion of the first electrode, and a second opening exposing a portion of the second electrode,
wherein the third electrode is in contact with the first electrode through the first opening, and
wherein the fourth electrode is in contact with the second electrode through the second opening.

5. The display device of claim 3, further comprising a second insulating layer on the third electrode and the fourth electrode.

6. The display device of claim 5, further comprising a wavelength conversion layer on the second insulating layer,
wherein the wavelength conversion layer comprises a wavelength conversion particle and a scattering particle, and
wherein the wavelength conversion particle is a quantum dot.

7. The display device of claim 3, further comprising a fixed layer surrounding at least a portion of an outer circumference of the light emitting element, wherein the fixed layer is between the third electrode and the fourth electrode.

8. The display device of claim 1, wherein a depth of the groove is smaller than a diameter of the light emitting element.

9. The display device of claim 8, wherein a width of the groove in a first direction is equal to a length of the light emitting element.

10. The display device of claim 1, further comprising:
a first bank between the substrate and the first electrode; and
a second bank between the substrate and the second electrode,
wherein the light emitting element is between the first bank and the second bank.

11. The display device of claim 1, wherein the first insulating layer comprises an organic material.

12. The display device of claim 1, further comprising a pixel circuit layer between the substrate and the light emitting element,
wherein the pixel circuit layer comprises at least one transistor.

\* \* \* \* \*